United States Patent
Gatherer (12)

(10) Patent No.: US 6,421,796 B1
(45) Date of Patent: Jul. 16, 2002

(54) EFFICIENT MEMORY ADDRESSING FOR CONVOLUTIONAL INTERLEAVING

(75) Inventor: Alan Gatherer, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/480,372

(22) Filed: Jan. 10, 2000

Related U.S. Application Data

(60) Provisional application No. 60/116,904, filed on Jan. 22, 1999.

(51) Int. Cl.$^7$ .............................................. G11C 29/00
(52) U.S. Cl. ..................................................... 714/702
(58) Field of Search ................................ 714/701–702, 714/761–762, 787–788

(56) References Cited

U.S. PATENT DOCUMENTS

| | | | | |
|---|---|---|---|---|
| 5,537,420 A | * | 7/1996 | Huang | 714/701 |
| 5,719,875 A | * | 2/1998 | Wei | 714/701 |
| 5,764,649 A | * | 6/1998 | Tong | 714/701 |
| 5,898,710 A | * | 4/1999 | Amrany | 711/157 |
| 5,912,898 A | * | 6/1999 | Khoury | 714/701 |
| 6,014,761 A | * | 1/2000 | Lachish et al. | 714/702 |

OTHER PUBLICATIONS

"Convolutional Interleaving for Digital Radio Communications" by Hanna in IEEE International Conference on Communication Oct. 1993 pp. 443–447.*

"Burst–Correcting Codes For The Classic Bursty Channel," G. David Forney, Jr., IEEE Transactions On Communications Technology, vol. COM–19, No. 5, 10/71, pp. 772–781.

* cited by examiner

*Primary Examiner*—Albert Decady
*Assistant Examiner*—C R Harris
(74) *Attorney, Agent, or Firm*—Pedro P. Hernandez; W. James Brady, III; Frederick J. Telecky, Jr.

(57) ABSTRACT

A method and a system for performing memory-based convolutional interleaving are disclosed. According to the disclosed method, delay lines (DL) are paired with one another within rows of a memory, where the pairing is effected so that the sum of the delay of the paired delay lines is constant over the rows. Both in transmission and in receipt of the interleaved data packets, one or more data packets are read from the oldest location of one of the paired delay lines, with one or more data packets from a received vector being written into this delay line; this reading and writing is repeated for each of the rows of the memory, advancing in a first direction. The process of reading and writing is then repeated for the other delay line in each of the rows of the memory, advancing in the opposite direction. The pairing of the delay lines (DL) in each row of the memory permits efficient implementation of convolutional interleaving, with a minimum of overhead processing required. The system may be implemented into a digital signal processor or other programmable logic device, such as may be used in a digital subscriber line modem.

30 Claims, 11 Drawing Sheets

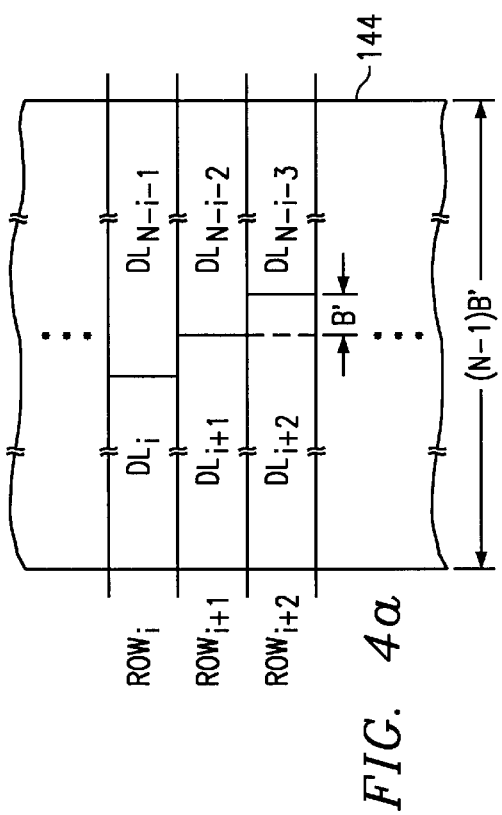
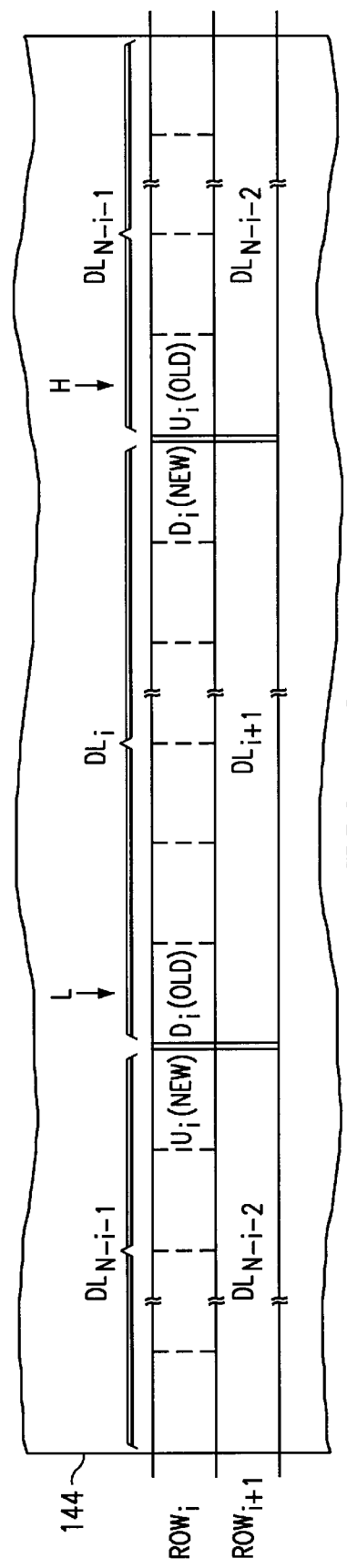
FIG. 4a
FIG. 4b $$\begin{pmatrix} S_{j,0}=D_0(0) \\ S_{j,1}=D_1(0) \\ S_{j,2}=D_2(0) \\ S_{j,3}=D_3(0) \\ S_{j,4}=U_3(0) \\ S_{j,5}=U_2(0) \\ S_{j,6}=U_1(0) \\ S_{j,7}=U_0(0) \end{pmatrix} \Rightarrow$$

|  | 144 | L |  |  | HM |  |
|---|---|---|---|---|---|---|
| ROW 0 | $U_0(-2)$ | $U_0(-1)$ | $U_0(-7)$ | $U_0(-6)$ | $U_0(-5)$ | $U_0(-4)$ | $U_0(-3)$ |
| ROW 1 | $U_1(-2)$ | $U_1(-1)$ | $D_1(-1)$ | $U_1(-6)$ | $U_1(-5)$ | $U_1(-4)$ | $U_1(-3)$ |
| ROW 2 | $U_2(-2)$ | $U_2(-1)$ | $D_2(-2)$ | $D_2(-1)$ | $U_2(-5)$ | $U_2(-4)$ | $U_2(-3)$ |
| ROW 3 | $U_3(-2)$ | $U_3(-1)$ | $D_3(-3)$ | $D_3(-2)$ | $D_3(-1)$ | $U_3(-4)$ | $U_3(-3)$ |

*FIG. 6a*

$D_2(0) \searrow$     L↓

| ROW 2 | $U_2(-2)$ | $U_2(-1)$ |  | $D_2(-1)$ | $U_2(-5)$ | $U_2(-4)$ | $U_2(-3)$ | → $D_2(-2)$ |
| ROW 3 | $U_3(-2)$ | $U_3(-1)$ | $D_3(-3)$ | $D_3(-2)$ | $D_3(-1)$ | $U_3(-4)$ | $U_3(-3)$ |

| ROW 2 | $U_2(-2)$ | $U_2(-1)$ | $D_2(0)$ | $D_2(-1)$ | $U_2(-5)$ | $U_2(-4)$ | $U_2(-3)$ |
| ROW 3 | $U_3(-2)$ | $U_3(-1)$ | $D_3(-3)$ | $D_3(-2)$ | $D_3(-1)$ | $U_3(-4)$ | $U_3(-3)$ |

*FIG. 6c*

$D_3(0) \searrow$     L↓

| ROW 2 | $U_2(-2)$ | $U_2(-1)$ | $D_2(0)$ | $D_2(-1)$ | $U_2(-5)$ | $U_2(-4)$ | $U_2(-3)$ |
| ROW 3 | $U_3(-2)$ | $U_3(-1)$ |  | $D_3(-2)$ | $D_3(-1)$ | $U_3(-4)$ | $U_3(-3)$ | → $D_3(-3)$ |

| ROW 2 | $U_2(-2)$ | $U_2(-1)$ | $D_2(0)$ | $D_2(-1)$ | $U_2(-5)$ | $U_2(-4)$ | $U_2(-3)$ |
| ROW 3 | $U_3(-2)$ | $U_3(-1)$ | $D_3(0)$ | $D_3(-2)$ | $D_3(-1)$ | $U_3(-4)$ | $U_3(-3)$ |

FIG. 6j $$\begin{pmatrix} D_0(0)=S_{j,0} \\ D_1(-1)=S_{j-1,1} \\ D_2(-2)=S_{j-2,2} \\ D_3(-3)=S_{j-3,3} \\ U_3(-4)=S_{j-4,4} \\ U_2(-5)=S_{j-5,5} \\ U_1(-6)=S_{j-6,6} \\ U_0(-7)=S_{j-7,7} \end{pmatrix}$$

EFFICIENT MEMORY ADDRESSING FOR CONVOLUTIONAL INTERLEAVING

This application claims priority under 35 USC 119(e)(1) of provisional application No. 60/116,904 filed Jan. 22, 1999.

CROSS REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of data communications, and is more specifically directed to error protection in data communications.

Recent advances in the electronics field have now made high-speed digital data communications prevalent in many types of applications and uses. Digital communication techniques are now used for communication of audio signals for telephony, with video telephony now becoming available in some locations.

The quality of communications carried out in these ways depends upon the accuracy with which the received signals match the transmitted signals. Some types of communications, such as audio communications, can withstand bit loss to a relatively large degree. However, the communication of digital data, especially of executable programs, requires exact fidelity in order to be at all useful. Accordingly, various techniques for the detection and correction of errors in communicated digital bit streams have been developed. Indeed, error correction techniques have effectively enabled digital communications to be carried out over available communication facilities, such as existing telephone lines, despite the error rates inherent in high-frequency communication over these facilities.

Error correction may also be used in applications other than the communication of data and other signals over networks. For example, the retrieval of stored data by a computer from its own magnetic storage devices also typically utilizes error correction techniques to ensure exact fidelity of the retrieved data; such fidelity is, of course, essential in the reliable operation of the computer system from executable program code stored in its mass storage devices. Digital entertainment equipment, such as compact disc players, digital audio tape recorders and players, and the like also now typically utilize error correction techniques to provide high fidelity output.

An important class of error detection and error correction techniques is referred to as Reed-Solomon coding, and was originally described in Reed and Solomon, "Polynomial Codes over Certain Finite Fields", *J. Soc. for Industrial and Applied Mathematics*, Vol. 8 (SIAM, 1960), pp. 300–304. Reed-Solomon coding uses finite-field arithmetic, such as Galois field arithmetic, to map blocks of a communication into larger blocks. In effect, each coded block corresponds to an over-specified polynomial based upon the input block. Considering a message as made up of k m-bit elements, a polynomial of degree n−1 may be determined as having n coefficients; with n greater than k (i.e., the polynomial is overspecified), not all of the n coefficients need be valid in order to fully and accurately recover the message. According to Reed-Solomon coding, the number t of errors that may be corrected is determined by the relationship between n and k, according to $$t \le \frac{n-k}{2}.$$

Reed-Solomon encoding is used to generate the encoded message in such a manner that, upon decoding of the received encoded message, the number and location of any errors in the received message may be determined.

Reed-Solomon decoding is especially beneficial in the detection and correction of random errors in a communicated bitstream. However, the limitation in the number of errors (i.e., the specified value t) that may be corrected by Reed-Solomon techniques precludes the correction of errors of a type referred to in the art as "burst errors". Burst errors refer to a contiguous error block in the communication channel, generally caused by effects in the communications facility, such as between the transmitting and receiving modems in a telephone communication implementation. Reed-Solomon techniques are generally unable to correct burst errors, because the number of errors in a given vector having a burst error is much greater than the Reed-Solomon correction limit t.

Convolutional interleaving is a conventional technique used to overcome this limitation of Reed-Solomon coding. In a general sense, convolutional interleaving operates by scrambling the time sequence of the transmitted bitstream from that of the conventional first-in-first-out sequence. At the receiving end, the received bitstream is then descrambled, or resequenced, to recover the transmitted message or data. Because of the scrambled sequence of the transmitted data, a burst error occurring within the scrambled bitstream over the communications facility will be dispersed over time. This reduces the density of the burst error in the actual transmitted message, permitting correction of the errors by subsequent Reed-Solomon decoding.

In general, convolutional interleaving introduces varying delay between adjacent codewords in a sequence, such that the temporal sequence of codewords, as transmitted, differs from the message sequence; an inversely varying delay is then introduced between received adjacent codewords, to restore the sequence. Attention is directed, in this regard, to FIG. 1 which illustrates the operation of conventional convolutional interleaving.

As shown in FIG. 1, demultiplexer 2 receives an input datastream on lines IN. This input datastream consists of a time series of symbols, each symbol containing M bits, according to the desired protocol. For example, conventional (204, 188, 8) Reed-Solomon coded transmissions generally operates according to eight-bit, or one byte, symbols (M=8). Demultiplexer 2 sequentially forwards symbols to N paths $5I_0$ through $5I_{N-1}$, of varying delay length. In this regard, demultiplexer 2 may be considered to include a buffering function, such that a vector of N symbols (or a multiple of N) is simultaneously applied to paths 5I. As described in Forney, "Burst-Correcting Codes for the Classic Bursty Channel", *IEEE Trans. on Communications Technology, Vol. COM*-19, No. 5 (October 1971), use of convolutional interleaving in combination with downstream Reed-Solomon decoding is optimized using a number of paths that is equal to the size N of the Reed-Solomon block length. The symbol or symbols in this vector that are applied to path $5I_0$ immediately precede, in the time sequence on lines IN, the symbol or symbols applied to path $5I_1$, and so on. Each of paths 5I lead to transmission channel 4, within which the symbols are resequenced and over which the symbols are serially communicated.

The varying delay among paths 5I has a regular pattern in conventional convolutional interleaving. In the example of FIG. 1, path $5I_0$ involves no delay, such that the symbol or symbols applied thereto by demultiplexer 2 are immediately forwarded to transmission channel 4. Path $5I_1$ involves a delay of B' symbols, where B' corresponds to the number of symbols applied to each path 5I by demultiplexer 2 in a given vector; the symbol or symbols applied to path $5I_1$ in a first cycle are thus communicated to transmission channel 4 in the next cycle. Path $5I_2$ involves a delay of 2B', such that the symbol or symbols applied thereto in the first cycle are communicated to transmission channel 4 two cycles later, and so on, up until path $5I_{n-1}$, which involves a delay of (N−1)B'.

The number B' corresponds to the ratio of the total number of symbols communicated in a vector (B) to the number of symbols upon which the appropriate decoding technology (e.g., Reed-Solomon) operates (N). Typically, in the Reed-Solomon coding case, N symbols a recommunicated in a single vector, such that B=N, and thus B'=1. In this case, therefore, N symbols are demultiplexed by demultiplexer 2 in a given operation, and one symbol is applied to each of N paths $5I_0$ through $5I_{N-1}$.

Because of the varying delays of N paths 5I, the system of FIG. 1 executes convolutional interleaving of the symbols to be communicated over transmission channel 4. Consider, for the sake of explanation, a communication system in which N=B=4, which presents symbols $S_{j,0}$ through $S_{j,3}$ in the $j^{th}$ communications cycle. The contents of the delay stages in paths $5I_0$ through $5I_3$ in this example would appear as follows:

| Path | Next symbol vector from demultiplexer 2 | Current contents of paths 5I | | |
|---|---|---|---|---|
| $5I_0$ | $S_{j,0}$ | | | |
| $5I_1$ | $S_{j,1}$ | $S_{j-1,1}$ | | |
| $5I_2$ | $S_{j,2}$ | $S_{j-1,2}$ | $S_{j-2,2}$ | |
| $5I_3$ | $S_{j,3}$ | $S_{j-1,3}$ | $S_{j-2,3}$ | $S_{j-3,3}$ |

In this arrangement, upon the application of the next symbol vector $S_j$ to paths 5I from demultiplexer 2, the symbols $S_{j, 0}$, $S_{j-1, 1}$, $S_{j-2, 2}$, and $S_{j-3, 3}$ will be applied to the transmission channel, and transmitted in that order. Accordingly, included in the sequence of transmitted signals over transmission channel 4, over time, will be the following symbols:

$S_{j-5, 3}$  $S_{j-1, 0}$  $S_{j-2, 1}$  $S_{j-3, 2}$  $S_{j-4, 3}$  $S_{j, 0}$  $S_{j-1, 1}$  $S_{j-2, 2}$  $S_{j-3, 3}$  $S_{j+1, 0}$  $S_{j, 1}$  $S_{j-1, 2}$

On the receiving end, the signals in this sequence are again placed in vector form, and are applied to output paths $5Q_0$ through $5Q_{N-1}$. According to this conventional convolutional interleaving approach inserts variable delay in each of output paths $5Q_0$ through $5Q_{N-1}$ between transmission channel and multiplexer 6, in an inverse manner relative to the delays of corresponding ones of paths $5I_0$ through $5I_{N-1}$. In this example, path $5Q_0$ inserts a delay of (N−1)B' symbols into the transmission path of the same symbols as communicated over path $5I_0$; similarly, path $5Q_1$ inserts a delay of (N−2)B' symbols, to which symbols communicated over path $5I_1$ are subjected. This arrangement continues, such that the sum of delays equals (N−1)B' symbols, for each pair of corresponding input path $5I_k$ and output path $5Q_k$. As a result, the vector presented by output paths 5Q to multiplexer 6 presents the symbols in sequence order. Using the same example of N=B=4 noted above, the contents of output paths 5Q following the receipt of the symbols transmitted by the above example of paths 5I are as follows:

| Path | Next symbol vector from transmission channel 4 | Current contents of paths 5Q | | |
|---|---|---|---|---|
| $5Q_0$ | $S_{j,0}$ | $S_{j-1,0}$ | $S_{j-2,0}$ | $S_{j-3,0}$ |
| $5Q_1$ | $S_{j,-1\ 1}$ | | $S_{j-3,1}$ | $S_{j-3,1}$ |
| $5Q_2$ | $S_{j,-2\ 2}$ | | | $S_{j-3,2}$ |
| $5Q_3$ | $S_{j,-3\ 3}$ | | | |

In this example, therefore, the vector presented by paths $5Q_0$ through $5Q_3$ upon this cycle is [$S_{j,-3\ 0}$, $S_{j-3,\ 1}$, $S_{j-3,\ 2}$, and $S_{j-3,\ 3}$]. Through the operation of multiplexer 6, a data sequence of symbols $S_{j-3,\ 0}$, $S_{j-3,\ 1}$, $S_{j-3,\ 2}$, and $S_{j-3,\ 3}$ are output on lines OUT, such symbols, of course, being in proper time sequence order.

The effects of convolutional interleaving may be seen from this example, considering that the most likely location of burst errors is present in transmission channel 4. Such burst errors, because of their density, could not be corrected by conventional error detection and correction techniques, if they were to occur over a series of symbols in their desired time sequence. However, because the time sequence of symbols communicated over transmission channel 4 is scrambled according to this conventional convolutional interleaving, any burst error will be spread out when presented on lines OUT by multiplexer 6. For example, consider the time sequence of symbols:

| $S_{j-5,3}$ | $S_{j-1,0}$ | $S_{j-2,1}$ | $S_{j-3,2}$ | $S_{j-4,3}$ | $S_{j,0}$ | $S_{j-1,1}$ | $S_{j-2,2}$ | $S_{j-3,3}$ | $S_{j+1,0}$ | $S_{j,1}$ | $S_{j-1,2}$ |
|---|---|---|---|---|---|---|---|---|---|---|---|

Consider a burst error in transmission channel 4 to affect four sequential symbols $S_{j-4,3}$, $S_{j,0}$, $S_{j-1,1}$, $S_{j-2,2}$, so that the actual transmission sequence appears as:

| $S_{j-5,3}$ | $S_{j-1,0}$ | $S_{j-2,1}$ | $S_{j-3,2}$ | ERR | ERR | ERR | ERR | $S_{j-3,3}$ | $S_{j+1,0}$ | $S_{j,1}$ | $S_{j-1,2}$ |
|---|---|---|---|---|---|---|---|---|---|---|---|

Upon resequencing by output paths $5Q_0$ through $5Q_3$ and multiplexer 6, these errors will be spread out in time as follows:

| $S_{j-5,3}$ | $S_{j-4,0}$ | $S_{j-4,1}$ | $S_{j-4,2}$ | ERR | $S_{j-3,0}$ | $S_{j-3,1}$ | $S_{j-3,2}$ | $S_{j-3,3}$ | $S_{j-2,0}$ | $S_{j-2,1}$ | ERR |
|---|---|---|---|---|---|---|---|---|---|---|---|
| $S_{j-2,3}$ | $S_{j-1,0}$ | ERR | $S_{j-1,2}$ | $S_{j-1,3}$ | ERR | $S_{j,1}$ | $S_{j,2}$ | $S_{j,3}$ | $S_{j+1,0}$ | $S_{j+1,1}$ | $S_{j+1,2}$ |

As evident from this table, the burst errors are spread out over time. This dispersion of the burst error permits the application of error detection and correction techniques, such as Reed-Solomon decoding, to correct the errors caused by the burst event, such errors not being correctable in many cases without the effects of interleaving.

In its most rudimentary form, paths 5I and 5Q are implemented by way of digital shift registers. For the example of B'=1, path $5I_1$ will thus include a single symbol shift register, path $5I_2$ will include a shift register of two symbol stages, and, accordingly, path $5I_k$ will include k symbol stages; conversely, output path $5Q_k$ will include (N−1−k) symbol stages. However, as is known in the art, a shift register realization of a convolutional interleaving scheme is costly, both from the standpoint of chip area required and also from the standpoint of speed and power performance; in addition, the shift register realization necessitates the use of custom logic, and eliminates the ability to use a programmable logic device such as a digital signal processor (DSP) or general-purpose microprocessor. As a result, a memory implementation of the convolutional interleaving function is desirable.

As described in DAVIC 1.0 Specification Part 08 (Digital Audio-Visual Council, 1996), conventional convolutional interleaving is defined by the parameters of interleaver block length (I) and interleaving depth (D). Block length I is equal to or a submultiple of the Reed-Solomon code word length, and in this regard corresponds to the number of paths in the arrangement of FIG. 1. Interleaving depth D refers to the number of blocks to be maintained in the memory, and as such corresponds to the parameter B discussed above. This realization is of course useful in performing such convolutional interleaving through use of a programmable logic device, such as a DSP or microprocessor. As noted in the DAVIC specification, this memory implementation is realized in D times I bytes of memory (for eight-bit symbols), which is quite costly in chip area, especially in the case of large Reed-Solomon schemes. In addition, a straightforward implementation of the shift register function in memory necessitates repeated read/write cycles to effectively shift the symbols along the table, such repeated cycles being quite inefficient. While one may alternatively maintain a pointer, for each input path and output path, that points to the memory location to next be accessed, N such pointers would be required to implement either a transmitter or receiver interleaving circuit. The varying delay length in each of the memory-implemented input and output paths also renders the maintenance of such pointers extremely cumbersome and inefficient in processing time; in addition, extensive control logic is necessitated in order to effect the wrapping around of pointers of varying length.

BRIEF SUMMARY OF THE INVENTION

It is therefore an object of the present invention to provide a memory-based method of effecting convolutional interleaving in an efficient manner.

It is a further object of the present invention to provide such a method in which the memory requirements are minimized.

It is a further object of the present invention to provide such a method in which the processing overhead required for maintenance of pointers is minimized.

Other objects and advantages of the present invention will be apparent to those of ordinary skill in the art having reference to the following specification together with its drawings.

The present invention may be implemented into a method of operating a programmable logic device to access memory in such a manner as to effect convolutional interleaving, either on the transmission or on the receive side. According to the present invention, the memory-implemented delay lines are paired with one another in such a manner as to be of substantially constant length. During a pass through the memory in a first direction, the oldest symbol in one of the paired delay lines is output and overwritten with the next symbol for that delay line, using a first pointer that is advanced upon completion of a pass in both directions. Upon completion of updating of the memory in the first direction, the oldest symbol in the other one of the paired delay lines is output and the newest symbol for that delay line is stored, using a second counter that advances upon completion of each delay line. As a result, delay lines of varying length are maintained in an efficient fashion. The present invention is suitable for both the transmission and receive sides of the communication.

BRIEF DESCRIPTION OF THE SEVERAL VIEWS OF THE DRAWING

FIGS. 4a and 4b are memory diagrams illustrating the arrangement of delay stages within the random access memory of the DSP of FIG. 3, for the transmission of data packets, according to the preferred embodiment of the invention.

FIGS. 6a through 6j are memory diagrams illustrating the contents of delay stages in the random access memory of the DSP of FIG. 3 in one example of the operation of the method of FIG. 5 according to the preferred embodiment of the invention.

DETAILED DESCRIPTION OF THE INVENTION

As will become apparent from the following description, the present invention provides benefits in the implementation and use of data communications operations, particularly when such operations are implemented within and carried out by a programmable logic device, such as a digital signal processor (DSP), microprocessor, and the like. As such, the present invention may be used in connection with various applications, including data communications over telephone facilities such as carried out between modems, data communications over high-speed data networks, and even the communication of digital data within a single computer such as between disk storage and the central processing unit. It is therefore contemplated that the description of the preferred embodiment of the invention herein, including its implementation in connection with a digital subscriber line (DSL) modem, will be understood by those in the art as exemplary only, and that those artisans having reference to this specification will be readily able to implement the present invention in other applications.

According to the preferred embodiment of the present invention, a programmable logic device realized as an integrated circuit is used to embody and carry out the present invention. While the particular architecture of such an integrated circuit may vary from that described herein according to the preferred embodiment of the invention, it will of course be understood that many different types of architectures and programmable logic devices may benefit from the use of the present invention. As such, it is to be understood that the following description is provided by way of example only, and is not intended to limit the scope of the present invention as hereinafter claimed.

Figure 2:
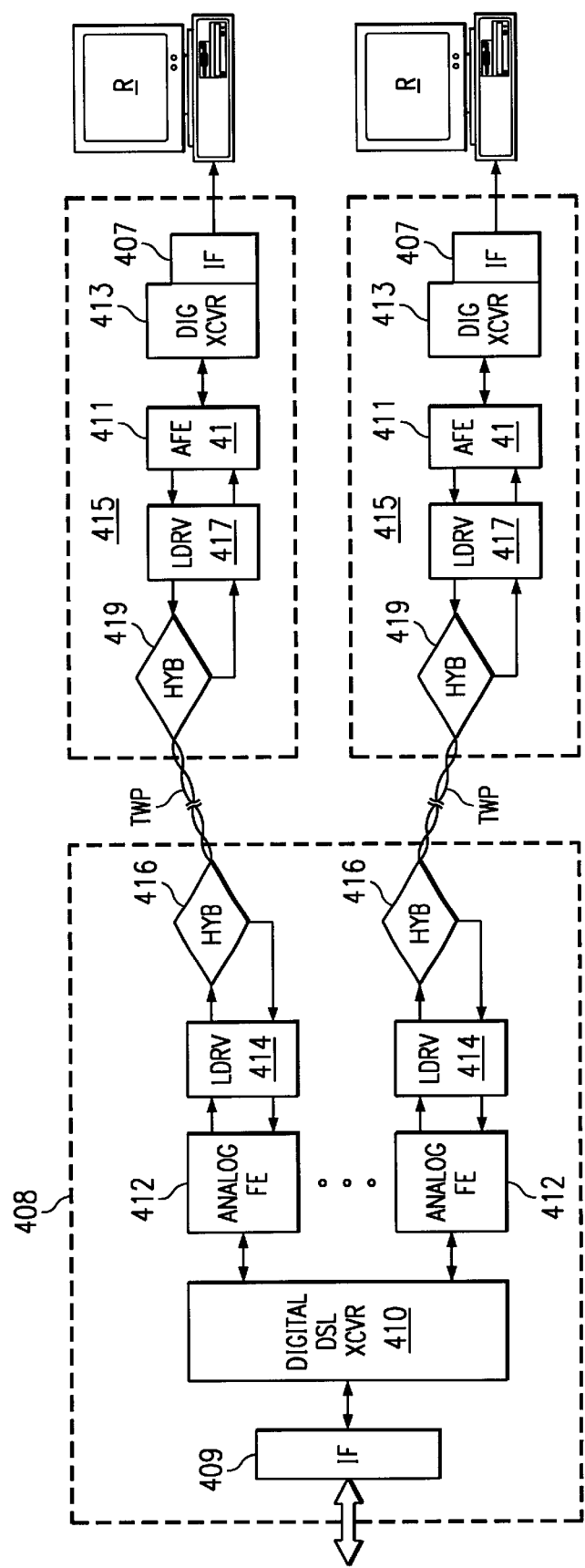
FIG. 2 is an electrical diagram, in block form, of a digital subscriber line (DSL) modem communications system into which the preferred embodiment of the present invention is implemented.

Referring now to FIG. 2, an example of an electronic system into which the present invention may be beneficially implemented will now be described by way of example; this exemplary system corresponds to digital subscriber line (DSL) modems, particularly those of the asynchronous type (i.e., ADSL modems), in which the modem at the remote user differs from that at the telephone system central office.

FIG. 2 illustrates a typical system installation of DSL services, in which multiple remote subscribers interface with a telephone system central office. In this example, a user in a home or office environment operates remote computer system R, such as a personal computer or workstation, or alternatively an entertainment unit in the video-on-demand (VOD) context. Each of remote computer systems R serves as a remote source and destination of communicated data, which may be representative of text, graphics, motion pictures, audio, etc. Each remote system R is associated with a remote DSL modem 415, by way of which the remote system R communicates with central office DSM modem 408 over a conventional twisted-pair telephone facility TWP. One or more telephones (not shown) may also be connected into each twisted pair wire facility TWP, such that "Plain Old Telephone Service" (POTS) voice communications may alternatively or additionally be communicated over twisted pair wire facility TWP. The DSL technology in the specific example of FIG. 2 may be of the asymmetric type (i.e., ADSL), with traffic traveling from central office modem 408 to remote modems 415 at a signal bandwidth that is higher in frequency than that of traffic traveling from remote modems 415 to central office modem 408 (i.e., upstream).

As illustrated in FIG. 2, each of twisted pair wire facilities TWP is received by central office DSL modem 408, which is contemplated to be located in a central office of the local or long distance telephone service provider. Central office modem 408, in this example, is capable of receiving multiple twisted pair wire facilities TWP (only two of which are illustrated in this example). Central office modem 408 provides communication of data between twisted pair wire facilities TWP, and thus remote systems R, and a host computer (not shown in FIG. 2) which serves as the source or destination of data, or as an intermediate gateway to a network, such as the Internet, or a dedicated "dial-up" content provider or network. Of course, the central office will typically also include switchgear for the routing of calls such as those placed by remote systems R (or associated telephones) over twisted pair wire facilities TWP. As noted above, central office modem 408 will likely be connected to a backbone network, which in turn is in communication with other communication paths by way of equipment such as routers or Digital Subscriber Line Access Multiplexers (DSLAMs). In the application where POTS service overlays the ADSL data traffic, such equipment may also include some type of "splitter" for separating POTS from the data traffic, routing the POTS traffic to the conventional telephone network (PSTN) and routing the data to a wide-area network (WAN).

In the example of FIG. 2, remote DSL modems 415 are each arranged as a plurality of functions, which roughly correspond to individual integrated circuits in this exemplary embodiment of the invention. It is of course to be understood that the particular integrated circuit, or "chip", boundaries among these various functions may vary among implementations; the exemplary realization illustrated in FIG. 2 is provided by way of example only. In this example, each of remote DSL modems 415 include a host interface 407, for interfacing digital transceiver function 413 with its associated remote system R. Host interface 407 is of conventional construction for such interface functions, an example of which is the TNETD2100 digital serial bus interface circuit available from Texas Instruments Incorporated.

According to this embodiment of the invention, digital transceiver function 413 in remote DSL modems 415 is a programmable device for executing the necessary digital processing operations for both transmission and receipt of the data payload. These operations include such functions as formatting of the digital data from the host computer system (into packets and frames, for example), Reed-Solomon encoding of the data for error correction purposes, convolutional interleaving of the packets in the data stream as will be described in detail below, encoding of the data into appropriate subchannels for transmission, and performing an inverse Fast Fourier Transform (IFFT) to transform the encoded data into time domain signals. On the receive side, digital transceiver function 413 performs the reverse of these operations, as well as echo cancellation processing. Following these operations as carried out by way of digital transceiver function 413, the decoded digital signals are then communicated to remote system R via interface 407. Particularly at the data rates discussed hereinabove, the digital data processing capacity and power of digital transceiver function 413 is preferably of a high level, preferably with capability on the order of that provided as digital signal processors of the TMS320C6x type available from Texas Instruments Incorporated.

According to the preferred embodiment of the invention, digital transceiver function 413 is implemented by way of a programmable integrated circuit, the construction and operation of which in performing these operations, and particularly for performing convolutional interleaving according to the preferred embodiment of the invention, will be described in further detail hereinbelow.

Each digital transceiver function 413 is bidirectionally connected to AFE 411, which is a mixed-signal (i.e., involving both digital and analog operations) integrated circuit which provides all loop interface components necessary for DSL communications other than those which involve high voltages. In this regard, AFEs 411 in each of remote DSL modems 415 perform both transmit and receive interface functions. In turn, AFEs 411 in each of remote modems 415 bidirectionally interface with line driver 417, which is a high-speed line driver and receiver for driving and receiving the ADSL signals on twisted pair facility TWP, such as the THS6002 line driver available from Texas Instruments Incorporated. Line drivers 417 in remote modems 415 are connected to a four-wire to two-wire "hybrid" integrated circuit 419, which converts the dedicated transmit and receive lines from line driver 417 to the two-wire arrangement of twisted pair facility TWP, in full-duplex fashion.

In the central office, central office DSL modem 408 includes host interface 409, which connects modem 408 to a host computer (not shown). Host interface 409 may, as noted above, be implemented by conventional circuitry such as the TNETD2100 digital serial bus interface circuit available from Texas Instruments Incorporated. As noted above, the host computer will interface central office modem 408 to a splitter for separating POTS from the data traffic, as noted above, and thus to the conventional telephone network (PSTN) and wide-area network (WAN) as appropriate for the service being provided. Central office modem 408 includes digital DSL transceiver function 410, which connects to multiple analog front end functions (AFEs) 412 as shown in FIG. 2. As in the case of remote DSL modems 415, AFEs 412 provide all loop interface components necessary for DSL communications other than those which involve high voltages, for both transmit and receive interface functions.

Digital transceiver function 410 is similarly constructed as and performs similar processing to digital transceiver functions 413 in remote DSL modems 415, with certain differences in function arising from the different frequencies of its received and transmitted traffic. As before, digital transceiver function 410 is preferably implemented as a high-performance digital signal processor, such as will be described hereinbelow, so that convolutional interleaving may be efficiently carried out thereby. These processing operations by digital transceiver function 410 are applied to encoded signals that are communicated over its associated twisted pair facility TWP to and from remote modem 415, after processing via hybrid 416, line driver 414, and AFE 412. Following such Reed-Solomon decoding as may be carried out by way of digital transceiver function 410, received decoded digital signals are communicated to the central office host computer via interface 409.

The advantages of the present invention as obtained in the DSL modem application are also, as noted above, useful in many other applications in which Reed-Solomon or similar decoding is required. The DSL modem implementation shown in FIG. 2 and described hereinabove is provided by way of example only. Examples of such other implementations include cable modems, set-top boxes for the receipt and decoding of digital video, disk drive communications within computers, other types of network communications among computer workstations, and the like.

Figure 3:
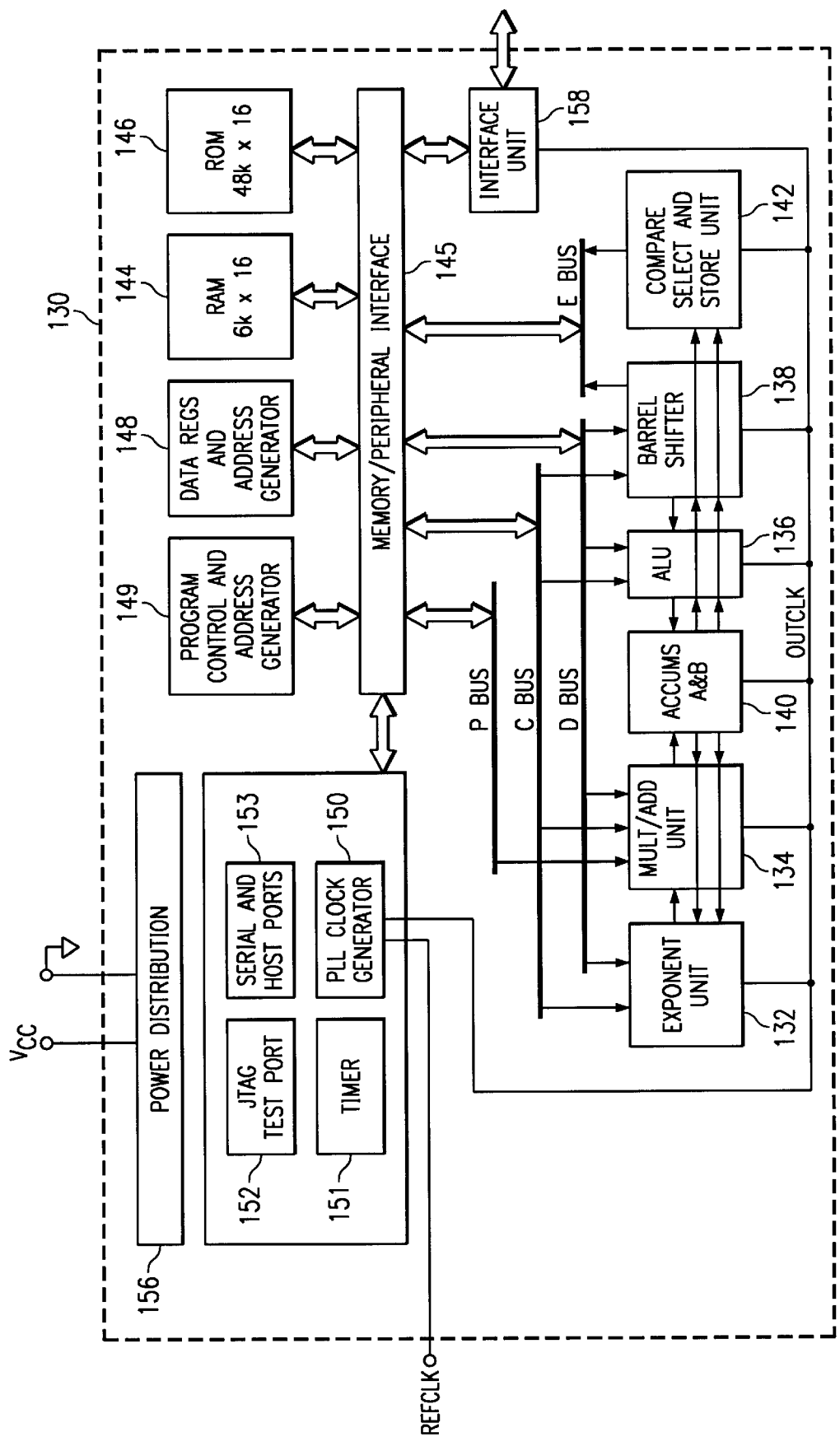
FIG. 3 is an electrical diagram, in block form, of a digital signal processor (DSP) into which the preferred embodiment of the present invention is implemented.

Referring now to FIG. 3, an example of a programmable logic device, in the form of digital signal processor (DSP) integrated circuit 130, into which the preferred embodiment of the invention may be implemented, will now be described. As noted above relative to the DSL system of FIG. 2, DSP 130 may be used as either or both of digital transceiver functions 410, 413. The architecture illustrated in FIG. 3 for DSP 130 is presented by way of example; this exemplary architecture corresponds generally to that of the TMS320c54 DSP available from Texas Instruments Incorporated. It will be understood by those of ordinary skill in the art, of course, that the present invention may be implemented into DSPs and general purpose microprocessors of other architectures, as well as integrated circuits of various functionality and architecture, including custom logic circuits and other VLSI and larger integrated circuits.

DSP 130 in this example is implemented by way of a modified Harvard architecture, and as such utilizes three separate data buses C, D, E that are in communication with multiple execution units including exponent unit 132, multiply/add unit 134, arithmetic logic unit (ALU) 136, barrel shifter 138. Accumulators 140 permit operation of multiply/add unit 134 in parallel with ALU 136, allowing simultaneous execution of multiply-accumulate (MAC) and arithmetic operations. The instruction set executable by DSP 130, in this example, includes single-instruction repeat and block repeat operations, block memory move instructions, two and three operand reads, conditional store operations, and parallel load and store operations, as well as dedicated digital signal processing instructions. DSP 130 also includes compare, select, and store unit (CSSU) 142, coupled to data bus E, for accelerating Viterbi computation, as useful in many conventional communication algorithms.

DSP 130 in this example includes significant on-chip memory resources, to which access is controlled by memory/peripheral interface unit 145, via data buses C, D, E, and program bus P. These on-chip memory resources include random access memory (RAM) 144, read-only memory (ROM) 146 used for storage of program instructions, and address registers 148. Program controller and address generator circuitry 149 is also in communication with memory/peripheral interface 145, and receives program instruction code from ROM 146 or from other storage via memory/peripheral interface 145, and generates control signals applied to each of the functional units of DSP 130 to control the execution of instructions corresponding to the received program instruction code. Interface unit 158 is also provided in connection with memory/peripheral interface 145 to control external communications, as do serial and host ports 153. Additional control functions such as timer 151 and JTAG test port 152 are also included in DSP 130.

The various logic functions executed by exemplary DSP 130 are effected in a synchronous manner, according to one or more internal system clocks generated by PLL clock generator 150. In this exemplary implementation, PLL clock generator 150 directly or indirectly receives an external clock signal on line REFCLK, such as is generated by other circuitry in the system or by a crystal oscillator or the like, and generates internal system clocks, for example the clock signal on line OUTCLK, communicated (directly or indirectly) to each of the functional components of DSP 130. DSP 130 also includes power distribution circuitry 156 for receiving and distributing the power supply voltage and reference voltage levels throughout DSP 130 in the conventional manner. Other functions, such as JTAG test interface circuitry, built-in self test circuitry, and the like may also be provided in DSP 130, in the conventional manner.

According to the preferred embodiment of the present invention, DSP 130 is programmed, for example by way of instruction code stored within ROM 146, to execute a convolutional interleaving process upon a stream of encoded data words received by interface unit 158 of DSP 130; these data words may either be data words to be transmitted, or which have been received, depending upon the direction of communication. In the architecture of DSP 130 as described above and as illustrated in FIG. 3, the execution of this convolutional interleaving instruction code is under the control of program control and address generator 149, which decodes the instructions stored in ROM 146 and which controls execution units such as ALU 136, and the like to carry out the instructions upon operands that are stored in accumulators 140, in data registers, or in RAM 144.

According to the preferred embodiment of the present invention, DSP 130, as implemented either or both as digital transceiver functions 413, 410 in the DSL modem system of FIG. 2 or in a similar function in another communications application, is programmed to access its available memory, such as RAM 144, in such a manner that convolutional interleaving is readily and efficiently realized. The operation of DSP 130 in performing such convolutional interleaving according to the preferred embodiments of the invention will now be described.

Figure 1:
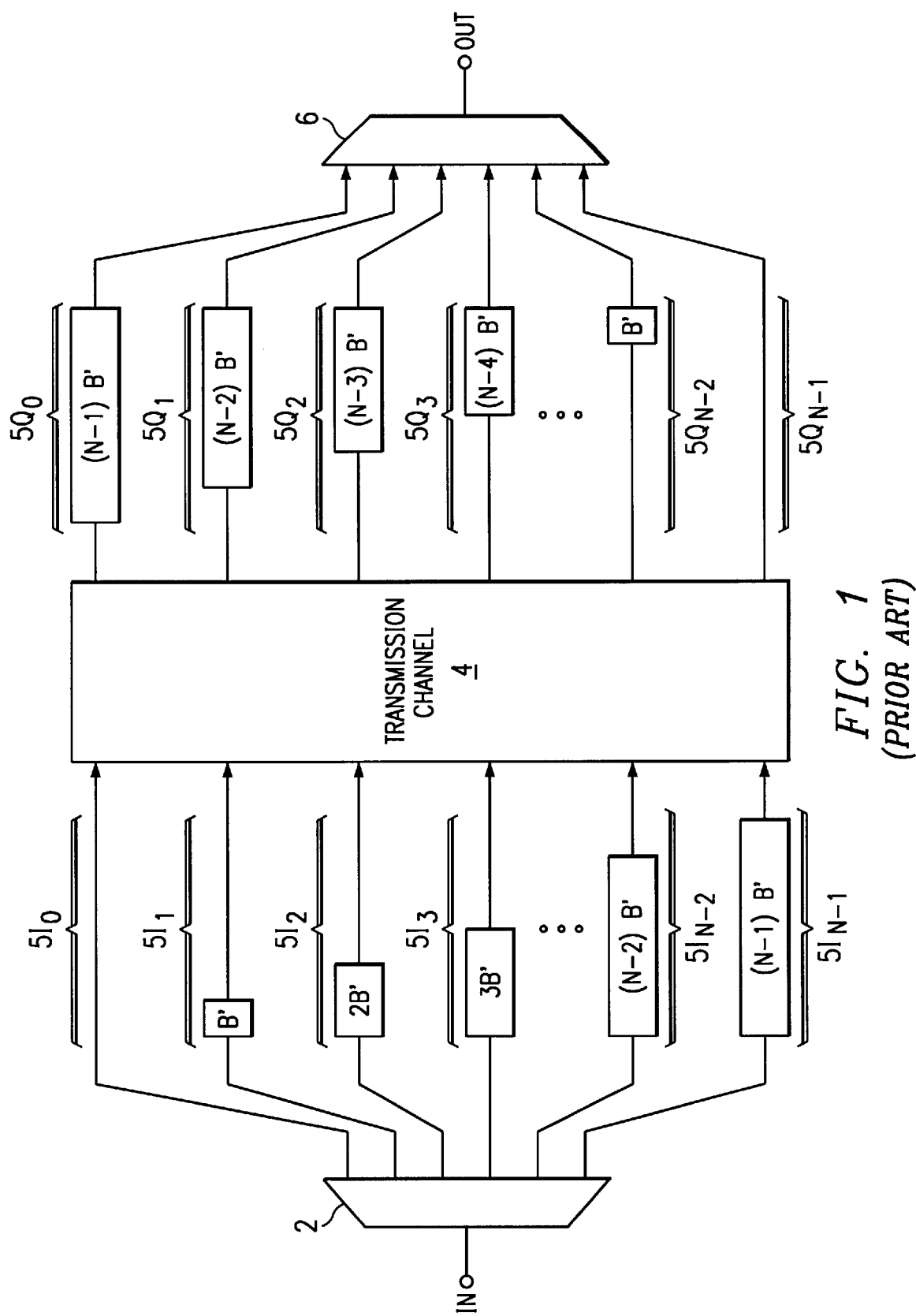
FIG. 1 is an electrical diagram, in block form, of a convolutional interleaving arrangement according to the prior art.

The description of the operation of a first preferred embodiment of the present invention begins with FIG. 4a, which illustrates a portion of RAM 144 used to implement the delay line structure for convolutional interleaving of packets. According to this embodiment of the invention, the delay lines DL corresponding to input paths 5I (see FIG. 1) are paired with one another so that each pair of delay lines DL collectively have a constant length, as arranged within RAM 144. For purposes of this description, parameters used in the convolutional interleaving of the preferred embodiments of the invention correspond to those described above relative to the conventional arrangement of FIG. 1, such that the number B' corresponds to the ratio of the total number of symbols communicated in a vector (B) to the number of symbols upon which the appropriate decoding technology (e.g., Reed-Solomon) operates (N). In the example of FIG. 4a, the ith row of RAM 144 contains memory locations corresponding to delay line $DL_i$ and to delay line $DL_{N-i-1}$. A boundary is present within row i of this portion of RAM 144 between the contiguous groups of memory locations corresponding to delay lines $DL_i$ and $DL_{N-i-1}$. Referring to FIGS. 1 and 4a in combination, delay line $DL_i$ can be considered to correspond to an input path $5I_i$ having a delay of i times B' and thus occupies iB' memory locations in row i of RAM 144. In this case, delay line $DL_{N-i-1}$ corresponds to input path $5I_{N-i-1}$ having a delay of B' times the quantity N-i-1 and thus occupies (N-i-1)B' memory locations in row i of RAM 144. The number of memory locations in row i of RAM 144 necessary to store the contents of delay lines $DL_i$ and $DL_{N-i-1}$ thus totals iB' memory locations plus (N-i-1)B' memory locations or, more simply, (N-1)B' memory locations.

FIG. 4b illustrates the arrangement of delay lines $DL_i$ and $DL_{N-i-1}$ in row i of RAM 144 in further detail. As illustrated in FIG. 4b, row i of RAM 144 operates as a circular buffer; in this example and at the illustrated point in time, delay line $DL_i$ is located within an interior portion of row i, and delay line $DL_{N-i-1}$ wraps around the physical (or logical) ends of the row. Within each of delay lines $DL_i$ and $DL_{N-i-1}$, packet entries range in age, from oldest to newest, with the latency of each packet depending, of course, upon the delay length of the associated delay line DL. In delay line $DL_i$, the oldest entry is indicated as entry $D_i$(old), to which a pointer L is currently pointing; the function of pointer L will be described below. Conversely, the newest entry of delay line $DL_i$ is illustrated in FIG. 4b as entry $D_i$(new). For delay line $DL_{N-i-1}$, the oldest entry $U_i$(old) is located adjacent to newest entry $D_i$(new) of delay line $DL_i$, and the newest entry $U_i$(new) is located adjacent to oldest entry $Di_i$(old) of delay line $DL_i$. The indicators $D_i$ and $U_i$ refer to the processing of the entries of delay lines $DL_i$ and $DL_{N-i-1}$ in the "downward" and "upward" directions in RAM 144, as will be described hereinbelow.

Of course, while the term "row" is used in this description as containing the paired delay lines, it will of course be understood by those in the art that the assignment of rows and columns within a memory can, in many implementations, be arbitrarily made. In other words, the paired delay lines may be associated with logical, rather than physical rows (or, conversely, columns). As known in the art, conventional DSP implementations consider the memory resource as a large "line" of memory, ignoring the physical width of the actual memory. As such, implementation of the convolutional interleaving function within a DSP, such as DSP 130 as described above, would utilize a circular buffer technique, such as a specific circular buffer command or a testing operation after each pointer increment, to access logical "rows" and "columns" of the memory to realize the delay lines DL. In contrast, implementation of the convolutional interleaving function within a custom hardware solution, such as an application specific integrated circuit (ASIC) using conventional dynamic random access memory (DRAM) for storage, may take advantage of the organization and operation of the DRAM by making the physical width of the memory equal to (N−1)B'. In such an implementation, row and column portions could be separated from the overall memory address, maintained in row and column pointers, respectively, and used to directly access the memory. This realization would avoid the necessity of a circular buffer command or testing operation to maintain the logical rows and columns of the memory, as required in the DSP implementation. In any event, the selection of the particular organization and orientation of the memory for the pairing of the delay lines will therefore generally depend upon the particular memory architecture available.

Referring back to FIG. 4a, the next row (row i+1) of RAM 144 stores the paired delay lines $DL_{i+1}$ and $DL_{N-i-1}$ (i.e., $DL_{N-(i+1)-1}$). Delay line $DL_{i+1}$ occupies (i+1) times B' memory locations, which is exactly B' memory locations more than the preceding delay line $DL_i$ in row i of RAM 144. Delay line $DL_{i+1}$ is paired, in row (i+1) of RAM 144, with delay line $DL_{N-i-2}$, which occupies (N−1−2) times B' memory locations, or exactly B' memory locations less than the succeeding delay line $DL_{N-i-1}$ in row i of RAM 144. Again, the collective memory size required in RAM 144 for storage of delay lines $DL_{i+1}$ and $DL_{N-i-2}$ equals (i+1)B' plus (N−1−2)B' memory locations, or (N−1)B' memory locations, equal to that of row i for delay lines $DL_i$ and $DL_{N-i-1}$.

This pairing of delay lines DL is similarly arranged throughout the portion of RAM 144 used for convolutional interleaving of transmitted packets, with the boundary between the paired delay lines DL advancing by B' memory locations, from row to row, as illustrated in FIG. 4a. Considering that N delay lines DL are to be used (including the trivial zeroth input path that includes no delay), and considering that two delay lines DL are assigned to each row of this portion of RAM 144, N/2 rows of memory locations in RAM 144 are required for storage of the delay lines DL for the case of an even number of input paths;

$$\frac{N}{2} + 1$$

rows are required for an odd number of input paths. The total number of memory locations thus required for the convolutional interleaving according to the preferred embodiment of the invention is $$\frac{N}{2}(N-1)B'$$

memory locations for N even, and $$\left(\frac{N}{2}+1\right)(N-1)B'$$

memory locations for N odd. The staggering of the boundary between paired delay lines DL is utilized in the writing of new packets into RAM 144 and the reading of packets therefrom, as will now be described relative to FIG. 5, in combination with an example of the operation of this embodiment of the invention as illustrated in FIGS. 6a through 6j for an exemplary communication having N=B=8, and thus B'=1.

The method of this preferred embodiment of the invention is performed in a repetitive fashion, for a sequence of a number of packet vectors, each vector including B data packets. As such, the method will be described, relative to FIG. 5, relative to the operation of DSP 130 upon one such packet vector within the sequence. It is contemplated that those of ordinary skill in the art having reference to this specification will readily recognize that the initialization of the memory-based delay lines according to this embodiment of the invention will be carried out in similar fashion as the method described below, except that a sequence of packets will include "don't care" or ignored values during this initialization period.

The method according to this preferred embodiment of the invention begins, in process 20, with DSP 130 receiving a packet vector, comprised of N times B' (i.e., B) data packets, and destined for transmission over a transmission channel. This packet vector may be retrieved by DSP 130 from its own memory (RAM 144) after prior processing, or alternatively may be received by DSP 130 directly from an external source. In the example of FIG. 6a, the packet vector includes eight data packets $S_{j,0}$ through $S_{j,7}$, with the j index indicating the temporal sequence of the packet vector, and the numeric index indicating the temporal sequence of the individual packets within the vector, with packet $S_{j,0}$ being earlier in time than packet $S_{j,1}$. For purposes of the description of the example according to FIGS. 6a through 6j, these packets are respectively referred to as packets $D_0(0)$, $D_1(0)$, $D_2(0)$, $D_3(0)$, $U_3(0)$, $U_2(0)$, $U_1(0)$, $U_0(0)$, with the numeric subscript referring to the row i of RAM 144 into which the packets will be stored, and with the numeric value within the parentheses referring to the temporal sequence of the packet vector. In this example, packet $D_0(0)$ is later in time than packet $D_0(-1)$.

Referring still to FIG. 6a, the state of a portion of RAM 144 according to this example is illustrated at the time of process 20. As noted above, the parameters N and B in this example each equal eight, and as such the parameter B' equals one. Since N is even, the number of rows i in RAM 144 used for effecting convolutional interleaving is four (rows 0 through 3), with each row i having seven elements. In this arrangement according to this preferred embodiment of the invention, and using the nomenclature of FIGS. 4a and 4b, delay lines $DL_0$ and $DL_7$ are paired with one another as packets $D_0$ and $U_0$ of row 0 in RAM 144; of course, since delay line $DL_0$ will involve no delay, there are no memory locations $D_0$ in RAM 144, as will be evident from the following description. Similarly, delay lines $DL_1$ and $DL_6$ are paired with one another as packets $D_1$ and $U_1$ in row 1, delay lines $DL_2$ and $DL_5$ are paired with one another as packets $D_2$ and $U_2$ in row 2, and delay lines $DL_3$ and $DL_4$ are paired with one another as packets $D_3$ and $U_3$ in row 3.

As may be readily seen in FIG. 6a, a pointer L is initialized to point to the location, within each of rows 1 through 3, of the oldest packet of delay lines $DL_1$ through $DL_3$ (i.e., packets $D_1(-1)$, $D_2(-2)$, $D_3(-3)$ in rows 1 through 3, respectively). Additionally, this point in time, a pointer HM is initialized to a location separated from the location of pointer L, by a distance of memory locations; this addition will wrap-around the end of the rows of RAM 144 as necessary. Pointer L will be used in the processing of data packets in a "downward" direction (increasing values of row index i), while pointer HM will be used in the processing of data packets in an "upward" direction (decreasing values of row index i), as will be described in detail below. These initial values of pointers L, HM are determined by the previous packet vectors stored in RAM 144 in this process, as will also become apparent from the following description.

Referring back to FIG. 5, DSP 130 next performs process 21, after the receipt of the packet vector in process 20. In process 21, DSP 130 initializes row index i to zero, to point to the first row. Also in this process 21, the first packet $D_0(0)$ in the received packet, this packet $D_0(0)$ being associated with the delay line $DL_0$ and thus involving no delay, is forwarded directly to the transmission channel, and is not stored in RAM 144. Process 22 is then performed, to increment the row index i, and control passes to process 24.

Process 24 is performed by DSP 130 to access the row of RAM 144 indicated by row index i, to output therefrom the contents of RAM 144 at the location indicated by pointer L, which contains the oldest $D_i$ packet in each row i. In the example of FIG. 6a, with row index i equal to 1, process 24 would output packet $D_1(-1)$, which is the oldest (and in fact the only) D packet therein. Following process 24, DSP 130 performs process 26 to write the next entry in the packet vector into the memory location indicated by pointer L in row i. In the current example of FIG. 6a with i=1, process 26 effects the writing of the next entry $D_1(0)$ into the location which previously contained the packet $D_1(-1)$. Decision 27 is next performed by DSP 130 to compare the value of row index i against the terminal value $$\left(\frac{N}{2}-1\right),$$

this terminal value being the last row of the portion of RAM 144 containing the data packets for the convolutional interleaving of data packets to be transmitted. If the current value of row index i is not at the terminal value $$\left(\frac{N}{2}-1\right),$$

control passes back to process 22 in which index i is incremented, following which processes 24, 26 and decision 27 are repeated.

Referring now to FIGS. 6b through 6e, the operation of processes 24, 26 upon rows 2 and 3 of the example of FIG. 6a will now be described. FIG. 6b illustrates the state of rows 2 and 3 of RAM 144 of this example upon completion of output process 24 with row index i=2. At this time, DSP 130 reads packet $D_2(-2)$ from location L of row 2, this packet $D_2(-2)$ being the oldest "D" packet in row 2, and outputs packet $D_2(-2)$ to the transmission channel as shown. As suggested in FIG. 6b, the next packet to be written to RAM 144 from the received packet vector is packet $D_2(0)$. Process 26 is then next performed, with row index i still equal to 2, in which this next packet $D_2(0)$ is written into the location pointed to by pointer L in row 2, as shown in FIG. 6c. As evident from FIG. 6c, the D packets $D_2(0)$ and $D_2(-1)$ are "out of order" relative to the age order of the "U" packets in row 2, and relative to the temporal order in which packets $D_2(-2)$ and $D_2(-1)$ were stored in row 2 prior to the most recent instance of processes 24, 26 for this row. The reordering of these packets will take place in the "upward" processing of packets in RAM 144, particularly in the processing of the "U" packets of row 2, as will be described below. Upon completion of process 26 for this row i=2, however, these packets $D_2(0)$, $D_2(-1)$ will remain in their out of order sequence. Decision 27 is then performed and, since i does not at this time equal the terminal value $$\left(\frac{N}{2}-1\right)$$

(which, in this example, equals 3), row index i increments to the value 3, and processes 24, 26 are repeated by DSP 130 as will now be described relative to FIGS. 6d and 6e.

FIG. 6d illustrates the result of process 24 for the case of row index i=3 in this example. As shown therein, the oldest "D" packet $D_3(-3)$ in row 3 is output by process 24, from the location indicated by pointer L in row 3. Pointer L has not been advanced at this time, and as such remains at the same column location in the arrangement of RAM 144 in this example, as it was for previous rows. As suggested in FIG. 6d, the next packet, from the received vector, to be written is packet $D_3(0)$. DSP 130 writes packet $D_3(0)$ to the indicated location L in row i=3 in this instance of process 26, resulting in the arrangement of FIG. 6e. As shown in FIG. 6e, the "D" packets in both of rows 2 and 3 are not arranged in temporal order at this time. Decision 27 is then performed to compare the current row index i against the terminal value; in this example at the stage of the process illustrated in FIG. 6e, the current value of index i indeed equals the terminal value of 3, returning a YES result for decision 27.

Referring back to FIG. 5, upon decision 27 returning a YES result, control passes to process 30. In process 30, DSP 130 sets a pointer H to the current value of pointer HM which, as noted above, equals the value of pointer L plus $$\left(\frac{N}{2}-1\right)B'.$$

This pointer HM points to the location of the oldest "U" packet (i.e., the oldest packet associated with the delay line $DL_{N-i-1}$ for i at the row index value in the last row), in the last row $$i=\left(\frac{N}{2}-1\right).$$

The row index i has not been incremented or decremented at this point, and as such remains at its terminal value (i.e., pointing to the last row in RAM 144 associated with the convolutional interleaving process). In process 32, DSP 130 then outputs the contents of RAM 144 in the current row i, at the location indicated by pointer H which, at this point, is the same location indicated by pointer HM.

FIG. 6f illustrates the result of the operation of process 32 in the example of FIG. 6a, for the row index value i=3. As illustrated therein, packet $U_3(-4)$ is output from RAM 144; this packet is the oldest "U" packet in row i=3 at this time, and is resident at the location indicated by pointer H. As suggested by FIG. 6f, the next packet in the vector to be written into RAM 144 is packet $U_3(0)$.

Referring back to FIG. 5, process 34 is next performed by DSP 130 to copy the contents of the current row i at the location indicated by pointer L to the location indicated by pointer H. This operation resequences the "D" packets into the proper temporal order. Following process 34, the next packet in the received packet vector is then written into the location of the current row i indicated by pointer L (and recently "vacated" or at least available, given the copying operation of process 32).

FIG. 6g illustrates the operation of processes 34, 36 in the example of FIG. 6a, for row i=3. Comparison of FIG. 6g to FIG. 6f illustrates that packet $D_3(0)$ has moved from the location in row i=3 indicated by pointer L to the location indicated by pointer H (occurring in process 34), and that new packet $U_3(0)$ is written to the location indicated by pointer L (in process 36). As a result of processes 34, 36 for this row, both the "D" and "U" packet sequences are in temporal order in row i=3 after the conclusion of this instance of processes 34, 36. Since row 2 has not yet been processed, its "D" and "U" packet sequences remain out of order.

Referring back to FIG. 5, DSP 130 next decrements the value of pointer H by B' memory locations. This decrementing operation prepares pointer H to point to the location of the oldest "U" packet of the next row to be processed. Decision 39 compares the current row index i to zero (i.e., the terminal row in the "upward" direction). If index i is not yet zero (decision 39 is NO), DSP 130 decrements the value of index i in process 40, and repeats processes 32, 34, 36 38 for the row indicated by the new value of row index i.

Referring to FIG. 6h, the example of FIG. 6a is illustrated at the point in time after the execution of process 32 for row index i=2. As illustrated therein, the oldest "U" packet in row 2, namely packet $U_2(-5)$, is output from RAM 144 at this point. The next packet to be written to RAM 144 from the received vector is packet $U_2(0)$. FIG. 6i illustrates that newest row 2 packet $D_2(0)$ is copied into the vacated location of row i=2 indicated by pointer H, and that the newest packet $U_2(0)$ is written into the location of row i=2 indicated by location L. At this point as shown in FIG. 6i, all packets in rows 2 and 3 are in temporal order.

Referring back to FIG. 5, processes 32, 34, 36, 38 are then repeated for each row i in the operative portion of RAM 144, until decision 39 determines that the last row (i=0) has been so processed, in which case the convolutional interleaving of the most recently received packet vector for transmission is then completed. For the example of FIG. 6a, the completion of this operation is illustrated in FIG. 6j, in which the state of this portion of RAM 144 upon decision 39 returning a YES result is shown. As indicated by FIG. 6j, an output packet vector has been created by the process. In this example, the packets in this output vector are respectively referred to as packets $D_0(0)$, $D_1(-1)$, $D_2(-2)$, $D_3(-3)$, $U_3(-4)$, $U_2(-5)$, $U_1(-6)$, $U_0(-7)$. The temporal staggering of these packets is clearly shown by the values in parentheses, which varies from 0 to −7. As shown in FIG. 6j, this output vector, in the nomenclature of FIG. 1, corresponds to the packets $S_{j,0}$, $S_{j-1, 1}$, $S_{j-2, 2}$, $S_{j-3, 3}$, $S_{j-4, 4}$, $S_{j-5, 5}$, $S_{j-6, 6}$, $S_{j-7, 7}$, with the first subscript index indicating the temporal staggering of these packets. As discussed above relative to FIG. 1, this output packet vector is then communicated over the appropriate transmission facility.

Referring back to FIG. 5, upon decision 39 returning a YES result, process 42 is then performed to increment the values of the L and HM pointers by B' memory locations, in preparation for the next packet vector to be processed. This incrementing accounts for the receipt of the last packet vector and the storing of the most recent packets, and the output of the oldest packets from each of the delay lines.

Control then passes to process 20, to begin processing of the next received packet vector for transmission by DSP 130.

As a result of the process described above relative to FIG. 5 and FIGS. 6a through 6j, convolutional interleaving is effected in an efficient manner, both relative to the memory resource requirements and also considering the processing overhead. As evident from the foregoing, the memory required for storage of the delayed packets is efficiently arranged into a rectangular form. This arrangement and the processing method described above not only efficiently utilizes memory resources, but also greatly streamlines the control required for accessing these packets. These advantages are readily seen by considering that the method may be performed under the control of only three counters in this embodiment of the invention (L, H, HM), and without requiring separate counters for each row of memory or each delay line that is implemented.

It is of course contemplated that various alternative techniques for effecting such convolutional interleaving will be apparent to those of ordinary skill in the art having reference to this specification. For example, while the above description was provided for the case where N is even, such that each delay line is paired with another within a given row of the memory, it is contemplated that those of ordinary skill in the art will be readily able to modify the above-described method to apply to the situation of N odd, by performing special processing for one of the rows and one of the delay lines, rendered unpaired because of the odd number N. Further, it is contemplated that the particular arrangement of packets within RAM 144 may be altered, in which case the specific time at which pointers are incremented or decremented will also be altered, without departing from the present invention. Further in the alternative, it is contemplated that a directional flag or other indicator may be used to control whether processing is carried out in the "downward" or "upward" directions. Variations in these, and other, programming details are contemplated to be within the scope of the present invention as hereinafter claimed.

In the DSL example of FIG. 2 described hereinabove, the transmitted data packets that have been processed according to the convolutional interleaving approach described hereinabove relative to FIGS. 5 and 6a through 6j, after additional processing, are communicated over twisted-pair telephone facility TWP. These packets are scrambled in time relative to one another, in the manner described hereinabove. On the receiving end, whether at central office 8 or at one of the remote modems 15, the corresponding digital transceiver function 410, 413 preferably resequences the time-scrambled packets according to the preferred embodiment of the invention as will now be described. While it is preferred that the sequencing and resequencing operations are both performed according to the preferred embodiments of the invention, it will, of course, be recognized that conventional convolutional interleaving processing may be carried out at either end of the communication. For example, the transmitting modem may effect its convolutional interleaving process according to the preferred embodiment of the invention described hereinabove, while the receiving modem may resequence the scrambled packets according to conventional techniques. This flexibility is available because the time-scrambling (or resequencing) performed according to the preferred embodiment of the invention does not alter the scrambled order of the output (or require a specific scrambling sequence). In this regard, it is contemplated that, in the case of two-way communications, one end of the communications system may perform convolutional interleaving according to the preferred embodiment of the invention on both data packets that it transmits and data packets that it receives, while the modem or other device with which two-way communications is being effected may use conventional convolutional interleaving upon both the very same packet sequences in its transmission and receipt.

Figure 7:
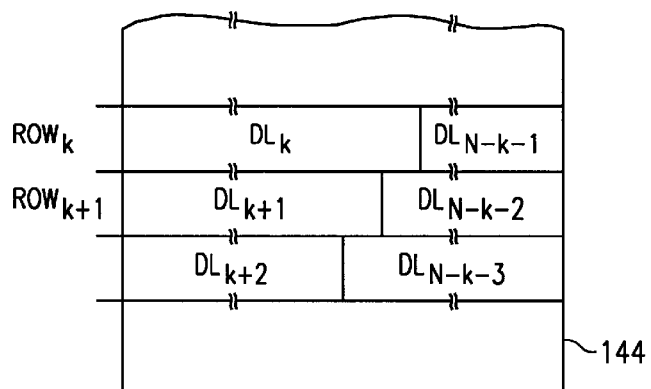
FIG. 7 is a memory diagram illustrating the arrangement of delay stages within the random access memory of the DSP of FIG. 3, for the receipt of transmitted packets, according to the preferred embodiment of the invention.

Referring now to FIGS. 7, 8a, 8b, and 9, a method of resequencing data packets that have been transmitted after convolutional interleaving, such as according to the method described hereinabove, will now be described. FIG. 7 illustrates a portion of memory 144, such as in RAM 144 of DSP 130 implemented within a modem as described hereinabove, as used in the resequencing of time-scrambled packets according to convolutional interleaving. As illustrated in FIG. 7, RAM 144 again includes a series of paired delay lines DL in each of its rows k associated with the convolutional interleaving function. In this embodiment of the invention, and consistent with the convolutional interleaving function in general as described above relative to FIG. 1, for a given data packet, the delay of its delay line DL at the receiving end is the inverse of that of the corresponding delay line at the transmission end, so that each packet sees an equal total delay relative to other packets in the communication. As such, delay line $DL_k$ in row k of RAM 144 in FIG. 7 has a longer delay than the next successive delay line $DL_{k+1}$ in row k+1 of RAM 144, and so on. Additionally, in similar manner as described above relative to FIG. 4a, delay line $DL_k$ is paired with delay line $DL_{N-k-1}$ in row k of RAM 144, delay line $DL_{k+1}$ is paired with delay line $DL_{N-k-1}$ in row k+1 of RAM 144, and so on.

Figure 8A:
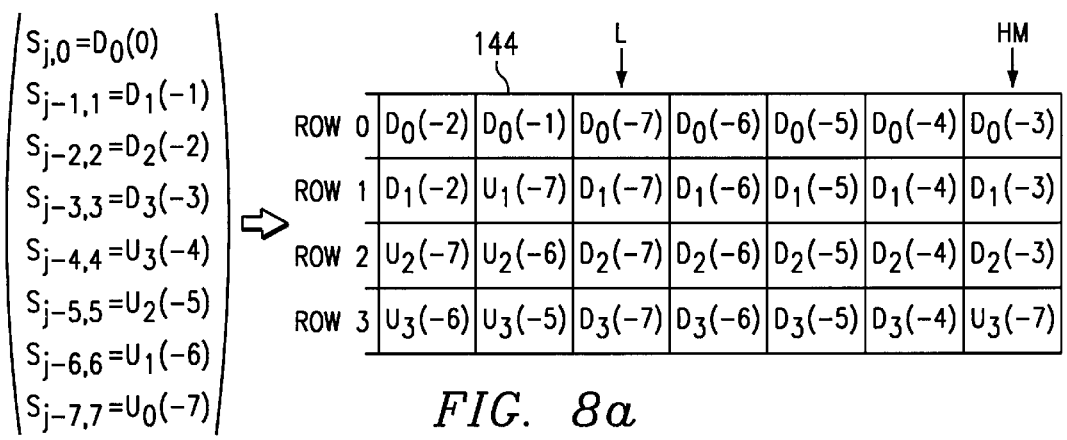
FIGS. 8a and 8b are memory diagrams illustrating the contents of delay stages in the random access random access memory of the DSP of FIG. 3 in one example of the operation of a resequencing method of data processed by way of convolutional interleaving, according to the preferred embodiment of the invention.
Figure 8B:
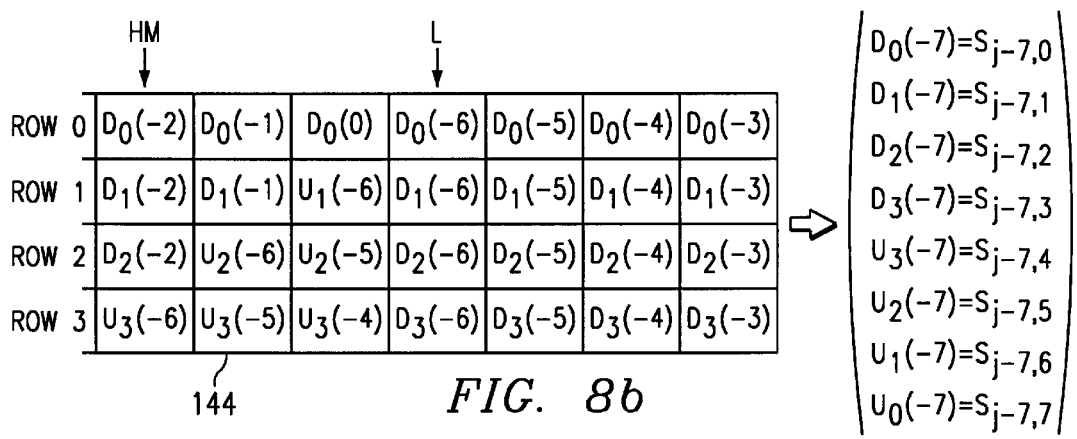
Figure 9:
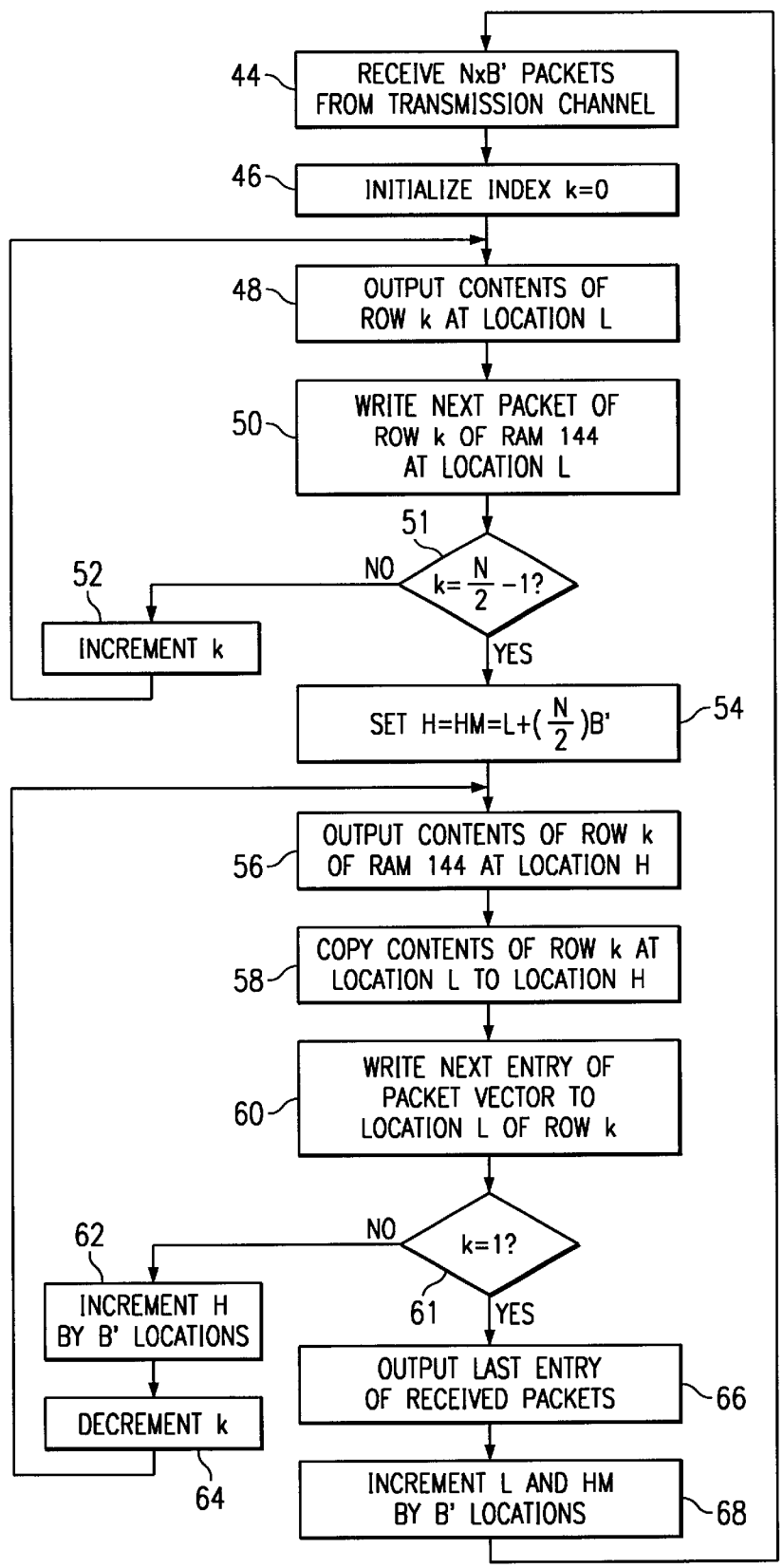
FIG. 9 is a flow diagram illustrating the operation of the preferred embodiment of the invention for resequencing data packets received over a communications facility in a time-scrambled manner by way of convolutional interleaving.

Referring now to FIG. 9, the method of resequencing received packets according to this preferred embodiment of the invention will now be described. In this regard, an example of the operation of this resequencing method upon the packet vector communicated relative to the example of FIGS. 6a through 6j will also be described relative to FIGS. 8a and 8b.

The method of this embodiment of the invention begins with process 44, in which DSP 130 in the receiving modem or other subsystem device receives a packet vector from its associated transmission channel, such as twisted-pair telephone facility TWP. Of course, during transmission, the packets within such a packet vector are communicated as a serial bitstream; upon receipt, conventional processing to arrange these packets into a vector is preferably performed. The size of this received packet vector is N times B', as in the case of the transmission discussed hereinabove.

FIG. 8a illustrates the state of a portion of RAM 144 in DSP 130 in the receiving subsystem, upon its receipt of a packet vector such as that communicated from the example of FIGS. 6a through 6j described above. As shown in FIG. 8a, this exemplary received vector (which is the same vector as transmitted in the example of FIG. 6j), in the nomenclature of FIG. 1, includes the packets $S_{j,0}$, $S_{j-1, 1}$, $S_{j-2, 2}$, $S_{j-3, 3}$, $S_{j-4, 4}$, $S_{j-5, 5}$, $S_{j-6, 6}$, $S_{j-7, 7}$, with the first subscript index indicating the temporal staggering of these packets. In this example of FIG. 8a, these received packets are arranged as packets $D_0(0)$, $D_1(-1)$, $D_2(-2)$, $D_3(-3)$, $U_3(-4)$, $U_2(-5)$, $U_1(-6)$, $U_0(-7)$, respectively, for purposes of the description of the method of FIG. 9. The temporal staggering of these packets is clearly shown by the values in parentheses, which varies from 0 to −7. The corresponding parameters in this example are again N=B=8, and B'=1.

Also as shown in FIG. 8a, various pointers are already initialized relative to RAM 144. Pointer L is initialized, from previous vector packet processing, to point to the column location of the oldest packet of the "downward" delay lines in RAM 144 in each row i of RAM 144. Pointer HM is initialized to a fixed distance from pointer L, specifically to the memory location corresponding to $$L + \left(\frac{N}{2}\right)B'$$

memory locations, with the addition wrapping around the end of the rows in RAM 144.

Referring again to FIG. 9, in process 46, DSP 130 also initializes the row index k to zero, so as to point to the first row in the portion of RAM 144 used for the resequencing of the convolutional interleaving.

An iterative downward loop of processes is then executed by DSP 130, beginning with process 48 in which DSP 130 outputs the contents of RAM 144 from the memory location indicated by pointer L in the row indicated by the current value of row index k. In general, process 48 will thus output the oldest packet $D_k$ of the "downward" delay line in that row. DSP 130 then performs process 50, in which the next B' packets in the received packet vector are written to the memory location indicated by pointer L, in the current row k. Decision 51 is then performed to compare the current value of the row index k against the terminal value $$\frac{N}{2} - 1,$$

which is the last row in the portion of RAM 144 used for the resequencing operation. If additional rows remain to be processed in this downward direction (decision 51 is NO), row index k is incremented in process 52, and processes 48, 50 are repeated for the next row.

In the example of FIG. 8a, the repeated operation of processes 48, 50 upon rows k=0 through k=3 will cause packets $D_0(-7)$, $D_1(-7)$, $D_2(-7)$, and $D_3(-7)$ to be output from RAM 144. As is evident from the temporal argument of each of these output packets, these packets are presented in their original temporal sequence, with no remaining interleaving. However, in all rows but the first (i.e., zeroth) row, the stored packets are out of temporal sequence, as the most recently received packets are written into the locations from which the oldest packets were read. In the example of FIG. 8a, packets $D_1(-1)$, $D_2(-2)$, and $D_3(-3)$ are written into the locations of rows 1 through 3 that were previously occupied by packets $D_1(-7)$, $D_2(-7)$, and $D_3(-7)$, respectively.

Upon completion of the downward processing (decision 51 is YES), DSP 130 sets the value of counter H to the current value of counter HM, in process 54. The iterative processing of the "upward" delayed packets U then begins with process 56, in which DSP 130 outputs the contents of the memory location corresponding to the value of pointer H in row k which, in the first upward pass, is still at the terminal value $$\frac{N}{2} - 1).$$

As evident from FIG. 8a, pointer HM (to which pointer H corresponds for row 3 of RAM 144) points to the oldest packet $U_3(-7)$ of the "upward" delay line in this last row.

Process 58 is then performed by DSP 130 to copy the contents of the memory location indicated by pointer L into the memory location indicated by pointer H in the current row k of RAM 144. As described above relative to FIG. 5, this operation serves to move the most recently written downward packet into its proper temporal order within the row. Process 60 then is executed by DSP 130 to write the newly received packet or packets for the upward pass of the current row k of RAM 144 into the memory location indicated by pointer L, which will be in the proper temporal order with the other "U" packets. For the example of FIG. 8a, in the bottommost row (k=3), process 56 will output packet $U_3(-7)$, process 58 will copy packet $D_3(-3)$ into the location previously occupied by packet $U_3(-7)$ (to which pointers H and HM point), and process 60 will effect the writing of newly received packet $U_3(-4)$ into the location of row k=3 indicated by pointer L (and, in this example, which was originally occupied by packet $D_3(-7)$).

DSP 130 then executes decision 61 in which the row index k is compared against one (i.e., the next-to-top row address of the operative portion of RAM 144). If additional rows remain to be processed in the upward direction (decision 61 is NO), pointer H is incremented by B' memory locations in a wrap-around fashion in process 62, and row index k is decremented in process 64. Control then passes back to process 56 for the next row. Processes 56, 58, 60 are then performed for the next higher row in RAM 144, until decision 61 determines that all rows but row k=0 have been processed. Upon decision 61 returning a YES result (indicating that row k=1 has been processed), process 66 is performed by DSP 130 to simply output the last packet or packets in the received vector. This is because no delay is inserted into the path of the packet having the longest delay in transmission. In the example of FIG. 8a, process 66 simply forwards packet $U_0(-7)$, which is the last packet in the received vector, as no delay is intended for this packet. Following process 66, DSP 130 increments the value of pointer L, and accordingly counter HM, by B' memory locations, so that pointer L points to the memory locations in RAM 144 at which the now-oldest downward packets reside. Control then passes to process 44 to await the receipt of the next transmitted packet vector from the communication facility.

Figure 5:
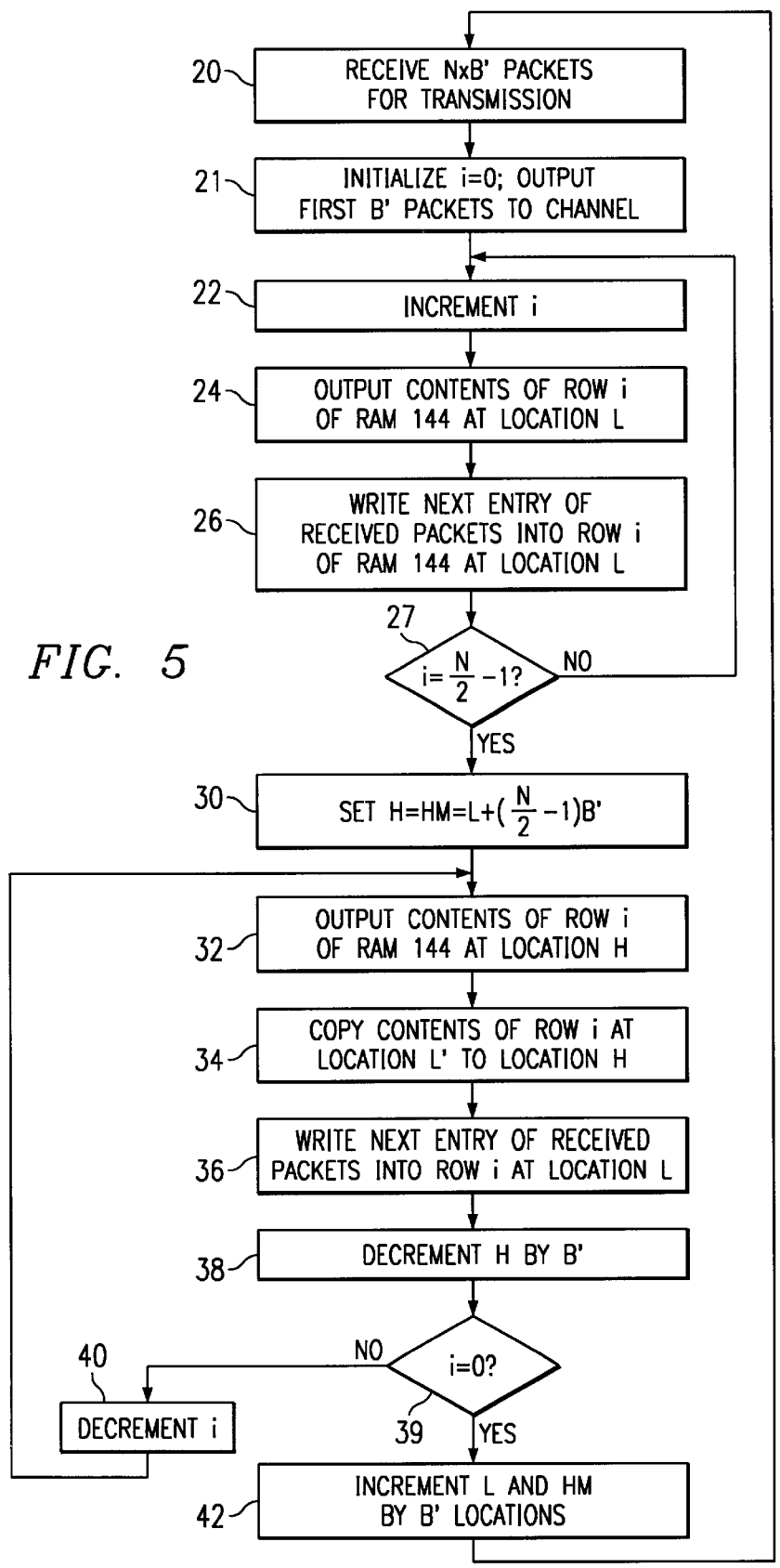
FIG. 5 is a flow chart illustrating the method of convolutional interleaving as performed by the DSP of FIG. 3 prior to transmission of data packets, according to the preferred embodiment of the invention.

FIG. 8b illustrates the state of the operative portion of RAM 144 after the completion of the processing of FIG. 9, for the example of the packet vector to which the convolutional interleaving process of FIG. 5 was applied as described above. As shown in FIG. 8b, pointer L has been incremented to now point to the oldest downward delay line packets $D_k(-6)$ in each row k of RAM 144; pointer HM is similarly incremented, wrapping around the end of the rows of RAM 144 to now point to the first memory location in each row. The output vector from RAM 144 is also illustrated in FIG. 8b as packets $D_0(-7), D_1(-7), D_2(-7), D_3(-7), D_4(-7), D_5(-7), D_6(-7), D_7(-7)$, which respectively correspond, according to the nomenclature of FIG. 1, to packets $S_{j-7, 0}, S_{j-7, 1}, S_{j-7, 2}, S_{j-7, 3}, S_{j-7, 4}, S_{j-7, 5}, S_{j-7, 6}, S_{j-7, 7}$. These packets are in the same temporal order as prior to transmission and the convolutional interleaving process described above.

As discussed above, this example and the corresponding method are presented for the case of N even, where all delay lines are completely paired. It is contemplated that those of ordinary skill in the art will be readily able to modify the above-described method to apply to the situation of N odd, by performing special processing for the one of the rows and delay lines that is rendered unpaired because of the odd number N.

As is evident from the foregoing description, the first preferred embodiment of the present invention provides a technique of effecting convolutional interleaving and resequencing of the interleaved packets that is quite efficient from a memory resource standpoint. According to another preferred embodiment of the present invention, which will now be described relative to FIGS. 10, 11a, and 11b, for the case of packets to be transmitted in interleaved fashion, a slight expansion of the memory resources used in the convolutional interleaving to provide B' spare memory locations in each column. These additional memory locations permit the newly received packets to be written into their eventual memory locations, so that swapping of packets within memory is not required.

Figure 10:
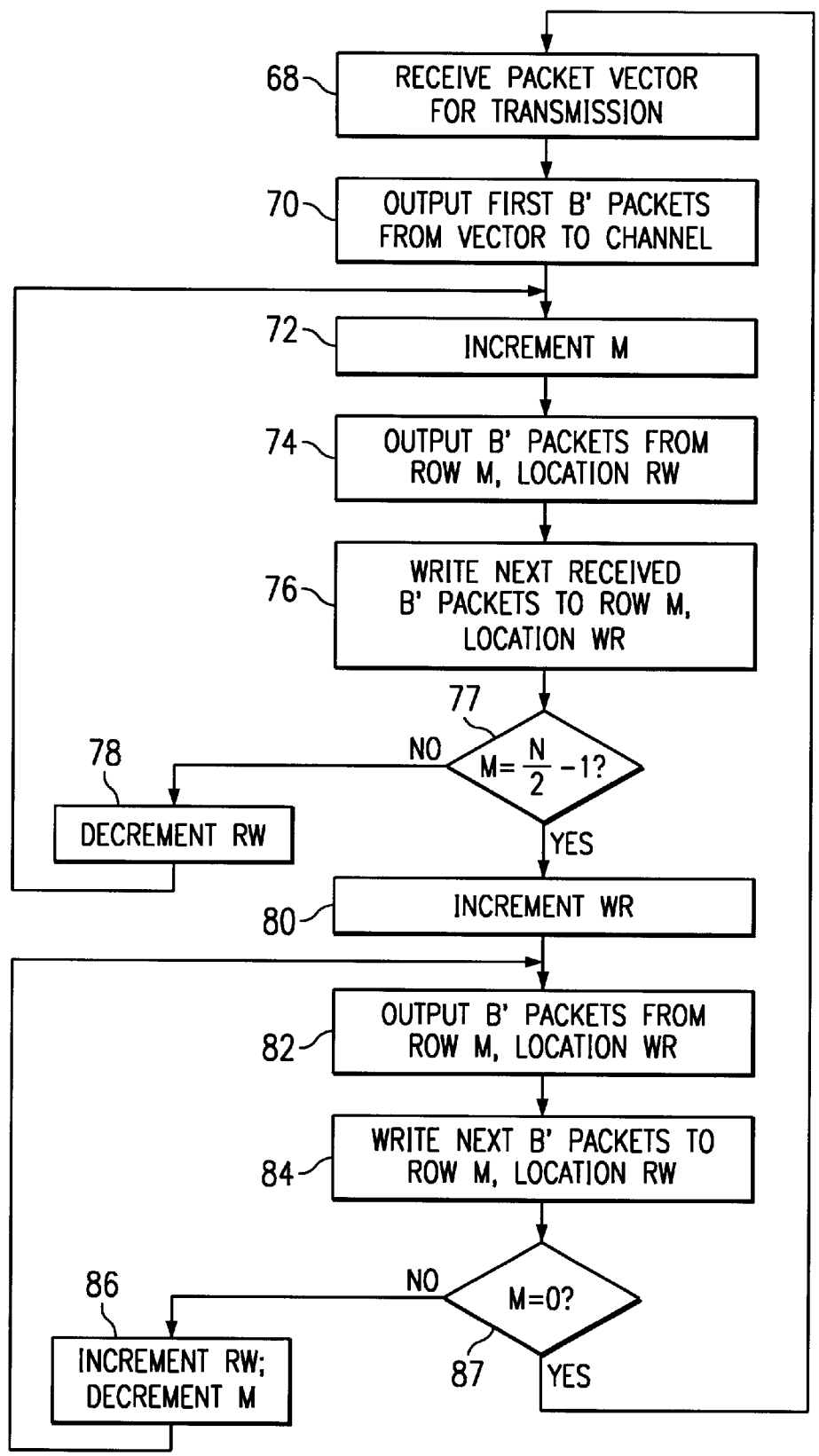
FIG. 10 is a flow diagram illustrating the operation of a second preferred embodiment of the invention for convolutional interleaving of data packets to be communicated over a communications facility in a time-scrambled manner.
Figure 11A:
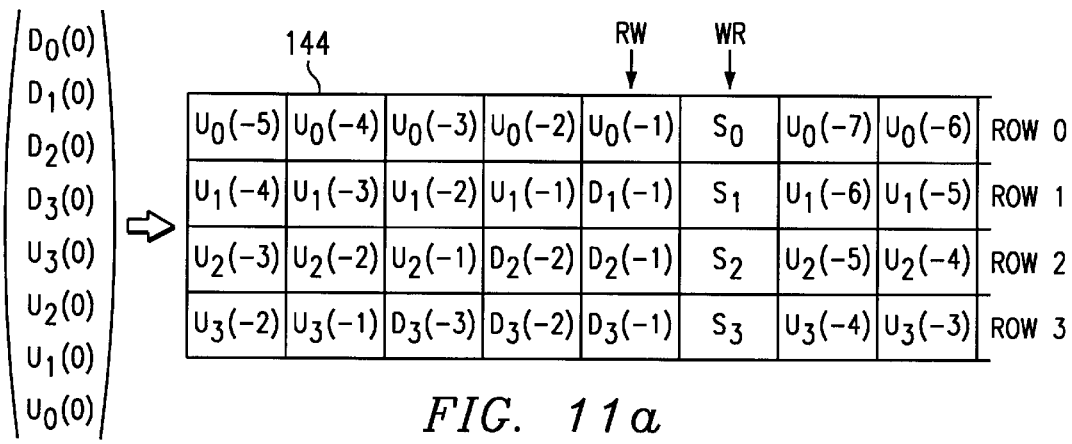
FIGS. 11a and 11b are memory diagrams illustrating the contents of delay stages in the random access random access memory of the DSP of FIG. 3 in one example of the operation of the method of convolutional interleaving of FIG. 10, according to the second preferred embodiment of the invention.

FIG. 11a illustrates the arrangement of a portion of RAM 144 according to an example of the operation of the method of FIG. 10 according to this embodiment of the invention. In the example of FIG. 11a, parameters N=B=8, and parameter B'=1, as in the previously used examples. According to this embodiment of the invention, however, eight memory locations are utilized in each row, such that seven packets U or D, as the case may be, are stored therein, along with spare memory location S in each row. The rows number from 0 to 3 in this example, also as before. According to a similar convolutional interleaving arrangement as described above relative to FIGS. 5 and 6a through 6j, row 0 of this portion of RAM 144 includes seven "upward" packets $U_0$, no "downward" packets $D_0$, and one spare memory location $S_0$; row 1 includes six "upward" packets $U_1$, one "downward" packet $D_1$, and one spare memory location $S_1$; row 2 includes five "upward" packets $U_2$, two "downward" packets $D_2$, and one spare memory location $S_2$; and row 3 includes four "upward" packets $U_3$, three "downward" packets $D_3$, and one spare memory location $S_3$. In this example, the spare memory locations $S_0$ through $S_3$ are aligned in the same column with one another.

The method of operation according to this embodiment of the invention begins, as shown in FIG. 10, with process 68 in which DSP 130 receives the next packet vector to be transmitted over the transmission facility. This packet vector, as before, includes N times B' packets, presented in parallel but having a temporal order therein. In the example shown in FIG. 11a, the new packet vector received in process 68 has includes packets $D_0(0), D_1(0), D_2(0), D_3(0), U_3(0), U_2(0), U_1(0), U_0(0)$; as before, the numeric subscript refers to the row i of RAM 144 into which the packets will be stored, and the numeric value within the parentheses refers to the temporal sequence of the packet vector. Process 70 is then performed by DSP 130, to forward the first B' packets from the received packet vector to the transmission channel, as these packets are not to be delayed in the convolutional interleaving process. At this point in time, row index m is either initialized to zero, or remains at zero from a previous pass through the method (as will be apparent below). Referring to FIG. 11a, where B'=1, vector $D_0(0)$ is forwarded directly to the transmission channel (as no $D_0$ vectors are being stored in RAM 144).

The iterative convolutional interleaving process, in the downward direction, is then next performed by DSP 130. In process 72, the row index m is incremented, to point to the next row in RAM 144. At this point in time, two pointers RW, WR have been set, from a previous pass through this method, to point to particular columns in RAM 144. Pointer WR points to the column of spare memory locations S, for example as shown in FIG. 11a. In the downward direction, pointer RW, on the other hand, points to the column containing the oldest vector to be output from the delay line under processing. In the example of FIG. 11a, considering that row 1 is the first row from which a packet will be read, pointer RW points to the column containing the oldest downward packet $D_1(-1)$.

Process 74 is then performed to output B' packets from the memory location pointed to by pointer RW in current row m of RAM 144. For the present example of FIG. 11a, where row index m is incremented from zero to one in process 72, packet $D_1(-1)$ would be output to the transmission channel. In process 76, DSP 130 then writes the next sequential B' packets in the received packet vector into the location pointed to by pointer WR in row m of RAM 144. In the example of FIG. 11a, process 76 would operate to write packet $D_1(0)$ into spare location $S_1$ of row m=1.

Decision 77 is then performed by DSP 130 to determine whether the last row of RAM 144 devoted to this convolutional interleaving has been processed, by comparing the current value of row index m against the terminal row value $$\frac{N}{2} - 1.$$

If additional rows remain to be processed (decision 77 is NO), pointer RW is then decremented (leftward, in FIG. 11a) in process 78. Control passes back to process 72 so that the value of row index m is incremented to point to the next row, and processes 74, 76 are repeated.

Upon the completion of the downward processing (decision 77 is YES), DSP 130 next increments pointer WR in process 80, moving it from the column that previously contained the spare locations S, to the column that contains, in each row, the oldest "upward" packet U. As evident in FIG. 11a, incrementing of pointer WR in the rightward direction will cause it to point to the column containing oldest packets $U_0(-7)$, $U_1(-6)$, $U_2(-5)$, $U_3(-4)$. At this point in time, pointer RW will be pointing to the third column (FIG. 11a), which is the column from which packet $D_3(-3)$ was read in the last instance of process 74.

Process 82 is then performed to output B' packets from the memory location indicated by pointer WR in row m. As noted above, this will output the oldest upward vector U from the current row m. In the example of FIG. 11a, with row index m still equal to 3, process 82 will effect the output of packet $U_3(-4)$, which is the oldest "upward" packet in row 3. Process 84 is then performed to write the next B' packets into the memory location indicated by pointer RW in current row m. In the example of FIG. 11a, the instance of process 84 for m=3 will write packet $U_3(0)$ into the location previously occupied by packet $D_3(-3)$, immediately to the right of packet $U_3(-1)$.

Decision 87 is then performed to compare the row index m against its terminal value zero (i.e., the first row in the portion of RAM 144 used for convolutional interleaving). If additional "upward" processing is required (decision 87 is NO), pointer RW is incremented and row index m is decremented in process 86, and processes 82, 84 are repeated for the next row in the upward direction. Upon the first row m=0 having been processed (decision 87 is YES), the convolutional interleaving has been completed for the received packet vector, and control passes back to process 68 to await the next vector to be interleaved.

Figure 11B:
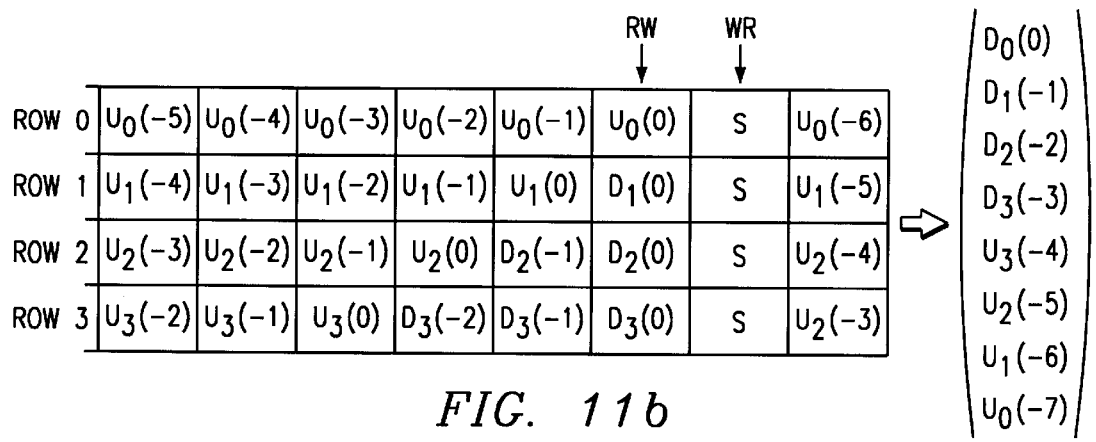

FIG. 11b illustrates the state of the portion of RAM 144 shown in FIG. 11a, after the completion of the processing to receive the new packet vector described above. As shown in FIG. 11b, an output packet vector including packets $D_0(0)$, $D_1(-1)$, $D_2(-2)$, $D_3(-3)$, $U_3(-4)$, $U_2(-5)$, $U_1(-6)$, $U_0(-7)$. The temporal staggering of these packets is clearly shown by the values in parentheses, which varies from 0 to −7. Also as shown in FIG. 11b, the column containing the spare memory locations S has shifted one (i.e., B') position to the right from that at which it began as shown in FIG. 11a. These spare memory locations S may, of course, contain the previous contents (if non-destructive reads are performed), but as these packets are no longer needed (having been output), these locations are available to be overwritten. Additionally, packets $D_m(0)$ and $U_m(0)$ received in the previous pass are stored in their temporal order within RAM 144 as shown. No swapping or copying was required in order to effect such ordering of these packets, because of the provision of the column of spare locations S as described above. As such, a slight increase in required memory resources provides a more streamlined processing for the convolutional interleaving according to the present invention, and as such this second embodiment of the present invention may be a preferred realization in some applications.

It is contemplated that those of ordinary skill in the art having reference to this specification will be able to readily recognize the corresponding method for the resequencing of the packets utilizing the spare memory locations, as in the transmission method of FIG. 10. Of course, as noted above, the technique used to resequence the packets need not match that used to effect convolutional interleaving on the transmission end, and vice versa, as the scrambled order of the interleaved packets is constant, regardless of the method used to effect such interleaving. As such, the resequencing method of FIG. 9 may be used upon the receipt of interleaved packets generated according to the method of FIG. 10, and vice versa.

The method of FIG. 10 was again described for the example of N even, such that each delay line in the convolutional interleaving process was paired with another. It is further contemplated that those of ordinary skill in the art will be readily able to implement this embodiment of the method for N odd, based upon the foregoing description and by including a special process for the memory row containing the unpaired delay line.

Other alternative realizations to the method of FIG. 10 are also contemplated to be within the scope of the invention. For example, the initial contents of the rows may be shifted from that illustrated in FIG. 11a, with the mth row being shifted by mB' to the right, such that the spare locations S are staggered from one another from row to row. In this arrangement, the upward packets $U_m$ of common time (e.g., $U_3(-4)$, $U_2(-4)$, $U_1(-4)$, $U_0(-4)$) will be aligned in the same column of RAM 144. In this example, pointer WR (initially pointing to the spare location $S_1$ for the second row) is again initially at one location to the right of pointer RW, but will be incremented from row to row in the downward direction as the received packets $D_m$ are written into the spare locations, while pointer RW remains in the same column, indicating the location of the oldest downward packets $D_m$ in each row. In the upward direction, pointer WR is then decremented from row to row as it points to the oldest upward packets $U_m$ being read, while pointer RW remains at the same location so that the received upward packets (e.g., $U_m(0)$) are all written into the memory locations from which the oldest downward packets $D_m$ were read in the downward pass, aligned in the same column. Although this implementation increments and decrements the WR pointer rather than the RW pointer as in the method of FIG. 10, the resultant operation of this realization is effectively the same, considering that the incrementing of pointer WR relative to pointer RW provides the same effect as decrementing pointer RW relative to pointer WR. It is contemplated that these and other alternative memory addressing schemes will be apparent to those of ordinary skill in the art having reference to this specification, and are within the scope of the invention as claimed herein.

As described above, the present invention provides important benefits in the convolutional interleaving of communicated data packets. In particular, great efficiency in the utilization of memory resources for such interleaving is obtained, without greatly increasing the computational complexity of managing the delay lines of varying lengths implemented in memory. The present invention will therefore improve the performance and reduce the cost of convolutional interleaving in many applications, particularly high-performance data communications systems and especially those in which digital processing is carried out by way of programmable logic devices such as digital signal processors and microprocessors.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A method of performing convolutional interleaving of a sequence of data packets among a plurality of memory-based delay lines of varying delay length, comprising the steps of:

receiving a vector of data packets;

outputting a first delayed data packet from a memory location in a first delay line region of a first row of memory;

storing a first one of the received data packets at a memory location in the first delay line region of the first row of memory;

outputting a next delayed data packet from a memory location within a next delay line region of a next row of memory, the next row being in a first direction from the preceding row;

storing a next received data packet at a memory location within the next delay line region of the next row in the memory;

repeating the steps of outputting a next delayed data packet and of storing a next received data packet, for a plurality of received data packets of the vector and a plurality of rows in the memory beginning with the first row and continuing to a terminal row having a terminal delay line region;

then outputting a next delayed data packet from a paired delay line region of the terminal row, the paired delay line region being different from the terminal delay line region;

storing a next received data packet at a memory location within the paired delay line region of the terminal row;

then outputting a next delayed data packet from a next paired delay line region of the next row from the terminal row in a second direction, opposite from the first direction;

storing a next received data packet at a memory location within the paired delay line region of the next row; and then repeating the steps of outputting a next delayed data packet from a paired delay line and of storing a next received data packet at a memory location within the paired delay line region, in the second direction, until the repeated outputting and storing steps are performed for a paired delay line in the first row.

2. The method of claim 1, wherein the first delay line region is shorter in delay than the next delay line region in the first direction.

3. The method of claim 2, further comprising:

after the receiving step and before the step of outputting a first delayed data packet, outputting a zeroth one of the received data packets.

4. The method of claim 1, wherein the first delay line region is longer in delay than the next delay line region in the first direction.

5. The method of claim 4, further comprising:

after the repeated outputting and storing steps for a paired delay line in the first row, outputting a last one of the received data packets.

6. The method of claim 1, further comprising:

communicating the delayed data packets output by the outputting steps over a transmission facility.

7. The method of claim 6, wherein the received data packets in the vector are in temporal message order.

8. The method of claim 7, further comprising:

receiving the communicated delayed data packets from the transmission facility;

outputting a first message data packet from a memory location in a first receive delay line region of a first row of receive memory;

storing a first one of the communicated delayed data packets at a memory location in the first receive delay line region of the first row of receive memory;

outputting a next message data packet from a memory location within a next receive delay line region of a next row of receive memory, the next row being in a first direction from the preceding row;

storing a next communicated delayed data packet at a memory location within the next receive delay line region of the next row in the receive memory;

repeating the steps of outputting a next message data packet and of storing a next communicated delayed data packet, for a plurality of communicated delayed data packets and a plurality of rows in the receive memory beginning with the first row and continuing to a terminal row having a terminal receive delay line region;

then outputting a next message data packet from a paired receive delay line region of the terminal row, the paired receive delay line region being different from the terminal receive delay line region;

storing a next communicated delayed data packet at a memory location within the paired receive delay line region of the terminal row;

then outputting a next message data packet from a next paired receive delay line region of the next row from the terminal row in a second direction, opposite from the first direction;

storing a next communicated delayed data packet at a memory location within the paired receive delay line region of the next row; and then repeating the steps of outputting a next message data packet from a paired receive delay line and of storing a next communicated delayed data packet at a memory location within the paired receive delay line region, in the second direction, until the repeated outputting and storing steps are performed for a paired receive delay line in the first row of the receive memory;

wherein the output message data packets are in temporal message order.

9. The method of claim 1, wherein each storing step stores a plurality of received data packets;

and wherein each outputting step outputs a plurality of delayed data packets.

10. A programmable system for performing convolutional interleaving, comprising:

a read/write memory, arranged in a plurality of rows, where each row is associated with a downward delay line region and an upward delay line region, the downward and upward delay line regions paired with one another in each row so that the memory locations occupied by the paired delay line regions is constant over the plurality of rows; and programmable logic, coupled to the read/write memory, programmed to perform the operations of:

receiving a vector of data packets;

outputting a first delayed data packet from a memory location in a first downward delay line region of a first row of the read/write memory;

storing a first one of the received data packets at a memory location in the first downward delay line region of the first row of the read/write memory;

outputting a next delayed data packet from a memory location within a next downward delay line region of a next row of the read/write memory, the next row being in a first direction from the preceding row;

storing a next received data packet at a memory location within the next downward delay line region of the next row in the read/write memory;

repeating the steps of outputting a next delayed data packet and of storing a next received data packet, for a plurality of received data packets of the vector and a plurality of rows in the read/write memory beginning with the first row and continuing to a terminal row having a downward delay line region;

then outputting a next delayed data packet from an upward delay line region of the terminal row;

storing a next received data packet at a memory location within the upward delay line region of the terminal row;

then outputting a next delayed data packet from a next upward delay line region of the next row from the terminal row in a second direction, opposite from the first direction;

storing a next received data packet at a memory location within the upward delay line region of the next row; and then repeating the steps of outputting a next delayed data packet from a upward delay line and of storing a next received data packet at a memory location within the upward delay line region, in the second direction, until the repeated outputting and storing steps are performed for an upward delay line in the first row.

11. The system of claim 10, further comprising:

a digital interface, coupled to the programmable logic, for communicating data packets to and from a host computer; and a communications interface, coupled to the programmable logic, for communicating data to and from a communications facility.

12. The system of claim 10, wherein the read/write memory and the programmable logic are implemented within a single integrated circuit.

13. The system of claim 10, wherein each memory location has a capacity for storing a plurality of data packets.

14. A method of performing convolutional interleaving of a sequence of data packets among a plurality of memory-based delay lines of varying delay length, comprising the steps of:

receiving a vector of data packets;

arranging a memory into a plurality of rows, each row having memory locations for storing data packets associated with a downward delay line and memory locations for storing data packets associated with an upward delay line, wherein the sum of the memory locations associated with the upward and downward delay lines in each row is constant over the plurality of rows;

outputting a delayed data packet from a memory location indicated by a first pointer, and associated with the downward delay line of a row of the memory indicated by a row index;

storing a data packet of the received vector into the memory location indicated by the first pointer, and associated with the downward delay line of a row of the memory indicated by the row index;

advancing the row index in a first direction;

repeating the outputting, storing, and advancing steps for the plurality of rows of the memory until the row index reaches a terminal value;

then outputting a delayed data packet from a memory location indicated by a second pointer and in the upward delay line of the row of the memory indicated by the row index;

copying the data packet associated with the downward delay line of the row of the memory indicated by the row index to the memory location indicated by the second pointer in the upward delay line of the row of the memory indicated by the row index;

storing a data packet of the received vector into the memory location indicated by the first pointer, and associated with the upward delay line of the row of the memory indicated by the row index;

advancing the row index in a second direction;

advancing the second pointer; and repeating the outputting, copying storing, and advancing steps for the plurality of rows of the memory until the row index reaches an initial value.

15. The method of claim 14, further comprising, prior to the step of outputting a delayed data packet from a memory location indicated by a second pointer and in the upward delay line of the row of the memory indicated by the row index, setting the second pointer to a value corresponding to the value of the first pointer plus a separation distance.

16. The method of claim 14, wherein the number of memory locations in each downward delay line increases with increasing row index values.

17. The method of claim 16, further comprising:

after the receiving step and before the step of outputting a delayed data packet, outputting a zeroth one of the data packets of the received vector.

18. The method of claim 14, wherein the number of memory locations in each downward delay line decreases with increasing row index values.

19. The method of claim 18, further comprising:

after the repeated outputting and storing steps for a paired delay line in the first row, outputting a last one of the data packets in the received vector.

20. The method of claim 14, further comprising:

communicating the delayed data packets output by the outputting steps over a transmission facility.

21. The method of claim 20, wherein the data packets in the received vector are in temporal message order.

22. The method of claim 14, wherein each storing step stores a plurality of data packets from the received vector; and wherein each outputting step outputs a plurality of delayed data packets.

23. A method of performing convolutional interleaving of a sequence of data packets among a plurality of memory-based delay lines of varying delay length, comprising the steps of:

receiving a vector of data packets;

arranging a memory into a plurality of rows, each row having memory locations for storing data packets associated with a downward delay line and memory locations for storing data packets associated with an upward delay line, and each row further including a spare memory location, wherein the sum of the memory locations associated with the upward and downward delay lines in each row is constant over the plurality of rows;

outputting a delayed data packet from a memory location indicated by a first pointer, and associated with the downward delay line of a row of the memory indicated by a row index;

storing a data packet of the received vector into the spare memory location of a row of the memory indicated by the row index, the spare memory location being indicated by a second pointer;

advancing the row index in a downward direction;

advancing the first pointer relative to the second pointer in a first direction;

repeating the outputting, storing, and advancing steps for the plurality of rows of the memory until the row index reaches a terminal value;

then outputting a delayed data packet from a memory location indicated by the second pointer and in the upward delay line of the row of the memory indicated by the row index;

storing a data packet of the received vector into the memory location indicated by the first pointer, and associated with the upward delay line of the row of the memory indicated by the row index;

advancing the row index in an upward direction;

advancing the first pointer relative to the second pointer in a second direction; and repeating the outputting, copying storing, and advancing steps for the plurality of rows of the memory until the row index reaches an initial value.

24. The method of claim 23, wherein the number of memory locations in each downward delay line increases with increasing row index values.

25. The method of claim 24, further comprising:

after the receiving step and before the step of outputting a delayed data packet, outputting a zeroth one of the data packets of the received vector.

26. The method of claim 23, wherein the number of memory locations in each downward delay line decreases with increasing row index values.

27. The method of claim 26, further comprising:

after the repeated outputting and storing steps for a paired delay line in the first row, outputting a last one of the data packets in the received vector.

28. The method of claim 23, further comprising:

communicating the delayed data packets output by the outputting steps over a transmission facility.

29. The method of claim 28, wherein the data packets in the received vector are in temporal message order.

30. The method of claim 23, wherein each storing step stores a plurality of data packets from the received vector; and wherein each outputting step outputs a plurality of delayed data packets.

* * * * *